(12) United States Patent
Matsushita et al.

(10) Patent No.: US 9,859,036 B2
(45) Date of Patent: Jan. 2, 2018

(54) CONDUCTIVE FILM FORMING COMPOSITION, CONDUCTIVE FILM, AND WIRING BOARD

(71) Applicant: FUJIFILM Corporation, Tokyo (JP)

(72) Inventors: Yasuaki Matsushita, Kanagawa (JP); Tokihiko Matsumura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 14/869,503

(22) Filed: Sep. 29, 2015

(65) Prior Publication Data

US 2016/0021741 A1 Jan. 21, 2016

Related U.S. Application Data

(63) Continuation of application No. PCT/JP2014/057331, filed on Mar. 18, 2014.

(30) Foreign Application Priority Data

Mar. 29, 2013 (JP) .................................. 2013-072642

(51) Int. Cl.
*H01B 1/22* (2006.01)
*H05K 1/09* (2006.01)
(Continued)

(52) U.S. Cl.
CPC ................. *H01B 1/22* (2013.01); *C09D 1/00* (2013.01); *C09D 5/24* (2013.01); *C09D 7/12* (2013.01); *H05K 1/09* (2013.01); *H05K 1/092* (2013.01); *H01B 3/445* (2013.01); *H05K 3/125* (2013.01); *H05K 3/282* (2013.01); *H05K 2201/0269* (2013.01); *H05K 2201/0338* (2013.01); *H05K 2201/0769* (2013.01)

(58) Field of Classification Search
None
See application file for complete search history.

(56) References Cited

U.S. PATENT DOCUMENTS

2010/0243303 A1* 9/2010 Arifuku ............. C08G 73/1039
174/258

FOREIGN PATENT DOCUMENTS

JP H05-331355 A 12/1993
JP 2009-188360 A 8/2009
(Continued)

OTHER PUBLICATIONS

Notification of Transmittal of Translation of the International Preliminary Report on Patentability and Translation of Written Opinion of the International Searching Authority; PCT/JP2014/057331 dated Oct. 8, 2015.
An Office Action issued by the Japanese Patent Office dated Feb. 9, 2016, which corresponds to Japanese Patent Application No. 2013-072642 and is related to U.S. Appl. No. 14/869,503; with English language translation.

(Continued)

*Primary Examiner* — Katie L Hammer
(74) *Attorney, Agent, or Firm* — Studebaker & Brackett PC

(57) ABSTRACT

A conductive film forming composition includes a fluorine atom-containing migration inhibitor and a metal particle, with the migration inhibitor including at least one selected from the group consisting of compounds represented by General Formulae (1) to (5), (22) and (23) as well as compounds having a group of General Formula (24) and a group of General Formula (25). The conductive film forming composition makes it possible to form a conductive film excellent in conductive characteristics and ion migration inhibiting function.

4 Claims, 1 Drawing Sheet

(51) Int. Cl.
*C09D 5/24* (2006.01)
*C09D 1/00* (2006.01)
*C09D 7/12* (2006.01)
*H01B 3/44* (2006.01)
*H05K 3/12* (2006.01)
*H05K 3/28* (2006.01)

(56) References Cited

FOREIGN PATENT DOCUMENTS

| | | |
|---|---|---|
| JP | 2010-087148 A | 4/2010 |
| JP | 2012-099236 A | 5/2012 |
| JP | 2013-120624 A | 6/2013 |

OTHER PUBLICATIONS

The First Office Action issued by the the State Intellectual Property Office of People's Republic of China dated Aug. 18, 2016, which corresponds to Chinese Patent Application No. 201480017991.2 and is related to U.S. Appl. No. 14/869,503; with English language translation.

International Search Report issued in Patent Application No. PCT/JP2014/057331, dated Jun. 10, 2014.

An Office Action issued by the Taiwanese Patent Office dated Apr. 10, 2017, which corresponds to Taiwanese Patent Application No. 103111144 and is related to U.S. Appl. No. 14/869,503; with English language translation.

* cited by examiner

CONDUCTIVE FILM FORMING COMPOSITION, CONDUCTIVE FILM, AND WIRING BOARD

CROSS REFERENCE TO RELATED APPLICATIONS

This application is a continuation of PCT International Application No. PCT/JP2014/057331 filed on Mar. 18, 2014, which claims priority under 35 U.S.C. §119(a) to Japanese Patent Application No. 2013-072642 filed on Mar. 29, 2013. Each of the above applications is hereby expressly incorporated by reference, in its entirety, into the present application.

BACKGROUND OF THE INVENTION

The present invention relates to a conductive film forming composition, and, more particularly, to a conductive film forming composition that contains a migration inhibitor containing a fluorine atom.

Further, the present invention relates to a conductive film formed by the above conductive film forming composition, and to a wiring board including the conductive film.

Conventionally, a wiring board in which metal wiring (conductive film) is disposed on the surface of an insulating substrate has been widely used in electronic members, semiconductor devices, and the like. As the metal constituting the metal wiring, silver and copper having high conductivity are generally used, but these metals have a problem in that ion migration easily occurs.

As a method of preventing the ion migration of the metals, a method of introducing a specific migration inhibitor into the metal wiring has been proposed (JP2012-99236 A).

SUMMARY OF THE INVENTION

In recent years, with the miniaturization of semiconductor integrated circuits and chip components, the microfabrication of metal wiring has progressed. Therefore, the width and the space of the metal wiring in a wiring board have become narrow, and the disconnection of a circuit due to ion migration has occurred more easily. Under such circumstances, it is required to further improve the insulation reliability between the metal wiring in the wiring board.

In addition, from the view point of improving the performance of various circuits and components, it is also required to further improve the conductive characteristics of the metal wiring.

In the case of fabricating a thin wire-shaped conductive film using a composition containing the specific migration inhibitor as disclosed in JP 2012-99236 A, when a large amount of migration inhibitor is contained in the conductive film so as to uniformly disperse the migration inhibitor in the conductive film and improve the insulation reliability between the conductive films, a large number of domains of the migration inhibitor is formed in the conductive film, and, as a result, the conductive characteristics of the conductive film deteriorate.

In contrast, when the content of the migration inhibitor in the conductive film is decreased in consideration of the conductive characteristics of the conductive film, the conductive characteristics of the conductive film is improved, but the insulation reliability between the conductive films is deteriorated.

As such, in the prior art, the conductive characteristics of a conductive film and ion migration inhibiting function of the conductive film (in other words, insulation reliability between conductive films) are in the relationship of trade-off in many cases, and thus technologies for achieving both at higher levels have been required.

In view of the above circumstances, an object of the present invention is to provide a conductive film forming composition capable of forming a conductive film which is excellent in conductive characteristics and an ion migration inhibiting function.

Another object of the present invention is to provide a conductive film which is made of the conductive film forming composition, and to provide a wiring board including the conductive film.

The present inventors carried out extensive studies. As a result, they have found that the above problems can be solved by using a migration inhibitor containing a fluorine atom.

That is, the present inventors have found that the above problems can be solved by the following configurations.

(1) A conductive film forming composition, comprising:
a migration inhibitor containing a fluorine atom; and
a metal particle.

(2) The conductive film forming composition according to the above (1), wherein the migration inhibitor includes at least one selected from the group consisting of compounds represented by General Formulae (1) to (5) to be described later, compounds represented by General Formula (22) to be described later, compounds represented by General Formula (23) to be described later, and compounds having a group represented by General Formula (24) to be described later and a group represented by General Formula (25) to be described later.

(3) The conductive film forming composition according to the above (1) or (2), wherein a metal atom contained in the metal particle is selected from the group consisting of gold, silver, copper, and aluminum.

(4) A conductive film, which is made of the conductive film forming composition according to any one of the above (1) to (3).

(5) A wiring board, comprising the conductive film according to the above (4).

(6) A wiring board, comprising:
a substrate; and
a conductive film containing a metal and disposed on the substrate,
wherein:
the conductive film has a surface layer region extending from an exposed surface of the conductive film to a depth position corresponding to $1/10$ of a total thickness of the conductive film, and an inner region corresponding to the conductive film exclusive of the surface layer region;
the conductive film contains a migration inhibitor containing a fluorine atom; and
the migration inhibitor contained in the surface layer region has a mass Y larger than a mass X of the migration inhibitor contained in the inner region.

According to the present invention, it is possible to provide a conductive film forming composition capable of forming a conductive film which is excellent in conductive characteristics and an ion migration inhibiting function.

Further, according to the present invention, it is possible to provide a conductive film which is made of the conductive film forming composition, and to provide a wiring board including the conductive film.

DETAILED DESCRIPTION OF THE INVENTION

Figure 1:
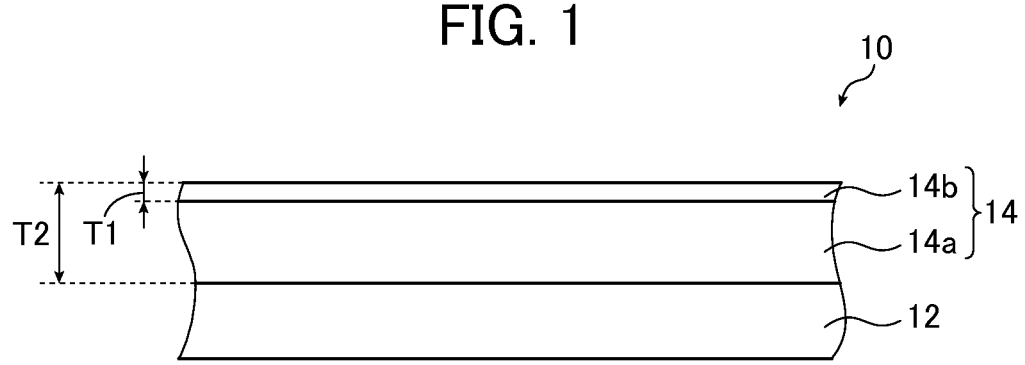
FIG. 1 is a schematic cross-sectional view showing a first embodiment of a wiring board of the present invention.

Hereinafter, preferred embodiments of the conductive film forming composition of the present invention will be described.

First, characteristic points of the present invention, compared to those of the prior art, will be described in detail.

One of the characteristic points of the present invention is to use a migration inhibitor containing a fluorine atom (hereinafter, referred to as "F-containing migration inhibitor"). When a conductive film is formed on a substrate using the conductive film forming composition of the present invention, since the surface energy of the F-containing migration inhibitor is low, the F-containing migration inhibitor is moved to the vicinity of the surface of the conductive film, and the F-containing migration inhibitor is unevenly distributed in the vicinity of the exposed surface (surface not in contact with the substrate) of the conductive film, thereby enabling both the conductive characteristics and ion migration inhibiting function of the conductive film, which are generally in the relationship of trade-off, to be achieved at higher levels. More specifically, by distributing a large amount of F-containing migration inhibitor in the vicinity of the external exposed surface of the conductive film, it is possible to efficiently suppress the diffusion of metal ions which are deposited onto the outside of the exposed surface of the conductive film from the vicinity of the exposed surface of the conductive film. In addition, by distributing a large amount of F-containing migration inhibitor in the vicinity of the outer surface of the conductive film, it is possible to reduce the content of impurities other than metals in the conductive film, and as a result, it is possible to form conduction paths in the conductive film and to achieve excellent conductive characteristics.

The conductive film forming composition (hereinafter, simply referred to as "composition") of the present invention contains at least an F-containing migration inhibitor and metal particles.

First, components contained in the composition will be described.

<F-containing Migration Inhibitor>

The F-containing migration inhibitor (anti-migration F-containing agent) is a compound that contains a fluorine atom and inhibits the ion migration of metal ions.

The content (fluorine content) of fluorine atoms in the F-containing migration inhibitor is suitably adjusted depending on the kind of metal particles used, but, in terms of the ion migration inhibiting ability between the conductive films to be formed being more excellent and the conductive characteristics of the conductive film also being more excellent (hereinafter, simply referred to as "in terms of the effects of the present invention being more excellent"), the content thereof is preferably 20 mass % or more and less than 65 mass %, more preferably 25 mass % to 60 mass %, and further preferably 30 mass % to 55 mass %.

Here, the fluorine content refers to the percentage (content) of mass occupied by fluorine atoms in the total molecular weight of the migration inhibitor. That is, the fluorine content is a value represented by {(the number of fluorine atoms in a compound)×(atomic weight of fluorine)/(total molecular weight of the compound)}×100(%). For example, when the total molecular weight of the migration inhibitor is 100 and the number of fluorine atoms is 3, the percentage (%) of mass occupied by fluorine atoms is calculated to be 57 mass % by {(19×3)/100}×100.

The kind of the F-containing migration inhibitor is not particularly limited, but, in terms of the effects of the present invention being more excellent, compounds represented by General Formulae (1) to (5), a compound represented by General Formula (22), a compound represented by General Formula (23), and a compound having a group represented by General Formula (24) and a group represented by General Formula (25) are preferable.

Hereinafter, these compounds will be described in detail.

(Compound Represented by General Formula (1))

First, the compound represented by General Formula (1) will be described.

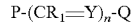  General Formula (1)

In the General Formula (1), each of P and Q is independently OH, $NR_2R_3$, or $CHR_4R_5$. However, when n is 0, P and Q are not concurrently $CHR_4R_5$, and not concurrently OH either. Y represents $CR_6$ or a nitrogen atom.

In the General Formula (1), each of $R_2$ and $R_3$ is independently represents a hydrogen atom or a group which can be substituted with a nitrogen atom.

The group which can be substituted with a nitrogen atom is not particularly limited as long as it can be substituted with a nitrogen atom, and examples thereof include an alkyl group (including a cycloalkyl group), an alkenyl group (including a cycloalkenyl group and a bicycloalkenyl group), an alkynyl group, an aryl group, a heterocyclic group, alkyl and aryl sulfinyl groups, alkyl and aryl sulfonyl groups, an acyl group, an alkoxy carbonyl group, an aryloxy carbonyl group, a carbamoyl group, a phosphino group, a phosphinyl group, and a group composed of any combination of these.

More specifically, preferred examples thereof include the following groups <A> to <M>.

<A> An alkyl group which is a linear, branched, or cyclic substituted or unsubstituted alky group. Examples of the alkyl group include an alkyl group (preferably, an alkyl group having 1 to 50 carbon atoms, for example, methyl, ethyl, n-propyl, isopropyl, t-butyl, n-octyl, eicosyl, 2-chloroethyl, 2-cyanoethyl, or 2-ethylhexyl), a cycloalkyl group (preferably, a substituted or unsubstituted cycloalkyl group having 3 to 50 carbon atoms, for example, cyclohexyl, cyclopentyl, or 4-n-dodecylcyclohexyl), and a bicycloalkyl group (preferably, a substituted or unsubstituted bicycloalkyl group having 5 to 50 carbon atoms, that is, a monovalent group obtained by removing one hydrogen atom from a bicycloalkane having 5 to SU carbon atoms, for example, bicyclo[1.2.2]heptane-2-yl, or bicyclo[2.2.2]octane-3-yl). Examples of the alkyl group further include a tricyclo structure having many cyclic structures and the like. Among the substituents to be described below, an alkyl group (for example, an alkyl group of an alkylthio group) represents the aforementioned alkyl group.

<B> An alkenyl group which is a linear, branched, or cyclic substituted or unsubstituted alkenyl group. Examples of the alkenyl group include an alkenyl group (preferably, a substituted or unsubstituted alkenyl group having 2 to 50 carbon atoms, for example, vinyl, allyl, prenyl, geranyl, or oleyl), a cycloalkenyl group (preferably, a substituted or unsubstituted cycloalkenyl group having 3 to 50 carbon atoms, that is, a monovalent group obtained by removing one hydrogen atom from cycloalkene having 3 to 50 carbon atoms, for example, 2-cyclopentene-1-yl or 2-cyclohexene-1-yl), and a bicycloalkenyl group (a substituted or unsubstituted bicycloalkenyl group, preferably a substituted or unsubstituted bicycloalkenyl group having 5 to 50 carbon atoms, that is, a monovalnet group obtained by removing one hydrogen atom from bicycloalkene having one double bond, for example, bicyclo[2.2.1]hept-2-en-1-yl or bicyclo[2.2.2]oct-2-en-4-yl.

<C> An alkynyl group (preferably, a substituted or unsubstituted alkynyl group having 2 to 50 carbon atoms, for example, ethynyl, propargyl, or a trimethylsilyl ethynyl group).

<D> An aryl group (preferably, a substituted or unsubstituted aryl group having 6 to 50 carbon atoms, for example, phenyl, p-tolyl, naphthyl, m-chlorophenyl, or o-hexadecanoylaminophenyl).

<E> A heterocyclic group (preferably, a monovalent group obtained by removing one hydrogen atom from a 5- or 6-membered substituted or unsubstituted aromatic or non-aromatic heterocyclic compound, and more preferably a 5- or 6-membered aromatic heterocyclic group having 3 to 30 carbon atoms, for example, 2-furanyl, 2-thienyl, 2-pyrimidinyl, or 2-benzothiazolinyl).

<F> Alkyl and aryl sulfinyl groups (preferably, a substituted or unsubstituted alkylsulfinyl group having 1 to 30 carbon atoms and a substituted or unsubstituted arylsulfinyl group having 6 to 30 carbon atoms, for example, methylsulfinyl, ethylsulfinyl, phenylsulfinyl, or p-methylphenylsulfinyl).

<G> Alkyl and aryl sulfonyl groups (preferably, a substituted or unsubstituted alkylsulfonyl group having 1 to 30 carbon atoms and a substituted or unsubstituted arylsulfonyl group having 6 to 30 carbon atoms, for example, methylsulfonyl, ethylsulfonyl, phenylsulfonyl, or p-methylphenylsulfonyl).

<H> An acyl group (preferably, a formyl group, a substituted or unsubstituted alkylcarbonyl group having 2 to 30 carbon atoms, a substituted or unsubstituted arylcarbonyl group having 7 to 30 carbon atoms, and a substituted or unsubstituted heterocyclic carbonyl group having 4 to 30 carbon atoms in which a carbon atom is bonded with a carbonyl group, for example, acetyl, pivaloyl, 2-chloroacetyl, stearoyl, benzoyl, p-n-octyloxyphenylcarbonyl, 2-pyridylcarbonyl, or 2-furylcarbonyl).

<I> An aryloxy carbonyl group (preferably, a substituted or unsubstituted aryloxy carbonyl group having 7 to 30 carbon atoms, for example, phenoxycarbonyl, o-chlorophenoxycarbonyl, m-nitrophenoxycarbonyl, or p-t-butyl-phenoxycarbonyl).

<J> An alkoxycarbonyl group (preferably, a substituted or unsubstituted alkoxycarbonyl group having 2 to 30 carbon atoms, for example, methoxycarbonyl, ethoxycarbonyl, t-butoxycarbonyl, or n-octadecyloxycarbonyl).

<K> A carbamoyl group (preferably, a substituted or unsubstituted carbamoyl group having 1 to 30 carbon atoms, for example, carbamoyl, N-methylcarbamoyl, N,N-dimethylcarbamoyl, N,N-di-n-octylcarbamoyl, or N-(methylsulfonyl)carbamoyl).

<L> A phosphino group (preferably, a substituted or unsubstituted phosphino group having 2 to 30 carbon atoms, for example, dimethylphosphino, diphenylphophino, or methylphenoxyphophino).

<M> A phosphinyl group (preferably, a substituted or unsubstituted phosphinyl group having 2 to 30 carbon atoms, for example, phosphinyl, dioctyloxyphosphinyl, or diethoxyphosphinyl).

Among the above functional groups, functional groups having a hydrogen atom may be further substituted by removing the hydrogen atom.

The alkyl group represented by $R_2$ and $R_3$ in the General Formula (1) is a linear, branched, or cyclic substituted or unsubstituted alkyl group. The alkyl group has preferably 1 to 50 carbon atoms, more preferably 1 to 30 carbon atoms, and particularly preferably 1 to 20 carbon atoms.

Preferable examples of the alkyl group include methyl, ethyl, n-propyl, isopropyl, cyclopropyl, butyl, isobutyl, t-butyl, sec-butyl, pentyl, isopentyl, neopentyl, t-pentyl, hexyl, cyclohexyl, heptyl, cyclopentyl, octyl, 2-ethylhexyl, nonyl, decyl, dodecyl, tetradecyl, hexadecyl, octadecyl, eicosyl, docosyl, triacontyl, and the like. More preferable examples thereof include methyl, ethyl, n-propyl, isopropyl, butyl, isobutyl, t-butyl, sec-butyl, t-butyl, pentyl, isopentyl, neopentyl, hexyl, cyclohexyl, octyl, 2-ethylhexyl, dodecyl, hexadecyl, and octadecyl. Particularly preferable examples thereof include methyl, ethyl, n-propyl, isopropyl, butyl, t-butyl, pentyl, isopentyl, hexyl, cyclohexyl, octyl, 2-ethylhexyl, dodecyl, hexadecyl, and octadecyl.

The alkyl group may include a linking group such as —CO—, —NH—, —O—, —S—, or a group composed of any combination of these. Here, when the linking group is included in the alkyl group, the position of the linking group is not particularly limited, and may be the terminal of the alkyl group. —S—$R_x$ ($R_x$: alkyl group) may be mentioned as an example.

The alkyl group represented by $R_2$ and $R_3$ may further include a substituent.

Examples of the substituent include a halogen atom, an alkyl group (including a cycloalkyl group), an alkenyl group (including a cycloalkenyl group and a bicycloalkenyl group), an alkynyl group, an aryl group, a heterocyclic group, a cyano group, a hydroxyl group, a nitro group, a carboxyl group, an alkoxy group, an aryloxy group, a silyloxy group, a heterocycloxy group, an acyloxy group, a carbamoyloxy group, an alkoxycarbonyloxy group, an aryloxycarbonyloxy group, an amino group (including an aniline group), an acylamino group, an amino carbonyl amino group, an alkoxycarbonyl amino group, an aryloxycarbonylamino group, a sulfamoylamino group, alkyl and aryl sulfonyl amino group, a mercapto group, an alkylthio group, an arylthio group, a heterocyclic thio group, a sulfamoyl group, a sulfo group, alkyl and aryl sulfinyl groups, alkyl and aryl sulfonyl groups, an acyl group, an aryloxy carbonyl group, an alkoxycarbonyl group, a carbamoyl group, aryl and heterocyclic azo groups, an imide group, a phosphino group, a phosphinyl group, a phosphinyloxy group, a phosphinylamino group, a silyl group, and a group composed of any combination of these.

More specifically, examples of the substituent include a halogen atom (for example, a chlorine atom, a bromine atom, or an iodine atom), an alkyl group, and an alkenyl group. Here, the alkyl group represents a linear, branched, or cyclic substituted or unsubstituted alkyl group. Examples of the alkyl group include an alkyl group (preferably, an alkyl group having 1 to 30 carbon atoms, for example, methyl, ethyl, n-propyl, isopropyl, t-butyl, n-octyl, eicosyl, 2-chloroethyl, 2-cyanoethyl, or 2-ethylhexyl), a cycloalkyl group (preferably, a substituted or unsubstituted cycloalkyl group having 3 to 30 carbon atoms, for example, cyclohexyl, cyclopentyl, or 4-n-dodecyl cyclohexyl), and a bicycloalkyl group (preferably, a substituted or unsubstituted bicycloalkyl group having 5 to 30 carbon atoms, that is, a monovalent group obtained by removing one hydrogen atom from bicycloalkane having 5 to 30 carbon atoms, for example, bicyclo[1.2.2]heptane-2-yl or bicyclo[2.2.2]octane-3-yl. Examples of the alkyl group further include a tricyclo structure having many cyclic structures, and the like. Among the substituents to be described below, an alkyl group (for example, an alkyl group of an alkylthio group) represents the aforementioned alkyl group.

The alkenyl group represents a linear, branched, or cyclic substituted or unsubstited alkenyl group. Examples of the alkenyl group include an alkenyl group (preferably, a substituted or unsubstituted alkenyl group having 2 to 30 carbon atoms, for example, vinyl, allyl, prenyl, geranyl, or oleyl), a cycloalkenyl group (preferably, a substituted or unsubstituted cycloalkenyl group having 3 to 30 carbon atoms, that is, a monovalent group obtained by removing one hydrogen atom from cycloalkene having 3 to 30 carbon atoms, for example, 2-cyclopentene-1-yl or 2-cyclohexen-1-yl), and a bicycloalkenyl group (a substituted or unsubstituted bicycloalkenyl group, preferably, a substituted or unsubstituted bicycloalkenyl group having 5 to 30 carbon atoms, that is, a monovalent group obtained by removing one hydrogen atom from bicycloalkene having one double bond, for example, bicyclo[2.2.1]hept-2-en-1-yl or bicyclo[2.2.2]oct-2-en-4-yl).

Examples of the substituent further include an alkynyl group (preferably, a substituted or unsubstituted alkynyl group having 2 to 30 carbon atoms, for example, ethynyl, propargyl, or a trimethylsilylethynyl group); an aryl group (preferably, a substituted or unsubstituted aryl group having 6 to 30 carbon atoms, for example, phenyl, p-tolyl, naphthyl, m-chlorophenyl, or o-hexadecanoylaminophenyl); a heterocyclic group (preferably, a monovalent group obtained by removing one hydrogen atom from a 5- or 6-membered substituted or unsubstituted aromatic or non-aromatic heterocyclic compound, and more preferably a 5- or 6-membered aromatic heterocyclic group having 3 to 30 carbon atoms, for example, 2-furanyl, 2-thienyl, 2-pyrimidinyl, or 2-benzothiazolinyl); a cyano group; a hydroxyl group; a nitro group; a carboxyl group; an alkoxy group (preferably, a substituted or unsubstituted alkoxy group having 1 to 30 carbon atoms, for example, methoxy, ethoxy, isopropoxy, t-butoxy, n-octyloxy, or 2-methoxyethoxy); an aryloxy group (preferably, a substituted or unsubstituted aryloxy group having 6 to 30 carbon atoms, for example, phenoxy, 2-methylphenoxy, 4-t-butylphenoxy, 3-nitrophenoxy, or 2-tetradecanoyl aminophenoxy); a silyloxy group (preferably, a silyloxy group having 3 to 20 carbon atoms, for example, trimethylsilyloxy or t-butyldimethylsilyloxy); a heterocycloxy group (preferably, a substituted or unsubstituted heterocycloxy group having 2 to 30 carbon atoms, for example, 1-phenyl tetrazole-5-oxy or 2-tetrahydropyranyloxy); an acyloxy group (preferably, a formyloxy group, a substituted or unsubstituted alkylcarbonyloxy group having 2 to 30 carbon atoms, and a substituted or unsubstituted arylcarbonyloxy group having 6 to 30 carbon atoms, for example, formyloxy, acetyloxy, pivaloyloxy, stearoyloxy, benzoyloxy, or p-methoxyphenylcarbonyloxy); a carbamoyloxy group (preferably a substituted or unsubstituted carbamoyloxy group having 1 to 30 carbon atoms, for example, N,N-dimethylcarbamoyloxy, N,N-diethylcarbamoyloxy, morpholino carbonyloxy, N,N-di-n-octyl aminocarbonyloxy, or N-n-octylcarbamoyloxy); an alkoxycarbonyloxy group (preferably a substituted or unsubstituted alkoxycarbonyloxy group having 2 to 30 carbon atoms, for example, methoxycarbonyloxy, ethoxycarbonyloxy, t-butoxycarbonyloxy, or n-octyl carbonyloxy); an aryloxycarbonyloxy group (preferably a substituted or unsubstituted aryloxycarbonyloxy group having 7 to 30 carbon atoms, for example, phenoxycarbonyloxy, p-methoxyphenoxy carbonyloxy, or p-n-hexadecyloxy phenoxycarbonyloxy); an amino group (preferably, an amino group, a substituted or unsubstituted alkylamino group having 1 to 30 carbon atoms, and a substituted or unsubstituted anilino group having 6 to 30 carbon atoms, for example, amino, methylamino, dimethylamino, anilino, N-methyl-anilino, or diphenylamino); an acylamino group (preferably, a formylamino group, a substituted or unsubstituted alkyl carbonylamino group having 1 to 30 carbon atoms, and a substituted or unsubstituted arylcarbonylamino group having 6 to 30 carbon atoms, for example, formylamino, acetylamino, pivaloylamino, lauroylamino, benzoylamino, or 3,4,5-tri-n-octyloxyphenylcarbonylamino); an aminocarbonylamino group (preferably, a substituted or unsubstituted aminocarbonylamino group having 1 to 30 carbon atoms, for example, carbamoylamino, N,N-dimethylaminocarbonyl amino, N,N-diethylamino carbonylamino, or morpholinocarbonylamino); an alkoxycarbonylamino group (preferably, a substituted or unsubstituted alkoxycarbonylamino group having 2 to 30 carbon atoms, for example, methoxycarbonylamino, ethoxycarbonylamino, t-butoxycarbonylamino, n-octadecyloxycarbonylamino, or N-methyl-methoxy carbonyl amino); an aryloxycarbonylamino group (preferably, a substituted or unsubstituted aryloxycarbonylamino group having 7 to 30 carbon atoms, for example, phenoxycarbonylamino, p-chloro phenoxycarbonylamino, or m-n-octyloxy phenoxycarbonylamino); a sulfamoylamino group (preferably, a substituted or unsubstituted sulfamoylamino group having 0 to 30 carbon atoms, for example, sulfamoylamino, N,N-dimethylaminosulfonylamino, or N-n-octyl aminosulfonylamino); alkyl and aryl sulfonylamino groups (preferably a substituted or unsubstituted alkylsulfonylamino having 1 to 30 carbon atoms, and a substituted or unsubstituted arylsulfonylamino having 6 to 30 carbon atoms, for example, methylsulfonylamino, butylsulfonylamino, phenyl sulfonylamino, 2,3,5-trichlorophenyl sulfonylamino, or p-methylphenyl sulfonylamino); a mercapto group; an alkylthio group (preferably, a substituted or unsubstituted alkylthio group having 1 to 30 carbon atoms, for example, methylthio, ethylthio, or n-hexadecylthio); an arylthio group (preferably, a substituted or unsubstituted arylthio group having 6 to 30 carbon atoms, for example, phenylthio, p-chlorophenylthio, or m-methoxyphenylthio); a heterocyclic thio group (preferably a substituted or unsubstituted heterocyclic thio group having 2 to 30 carbon atoms, for example, 2-benzothiazolylthio or 1-phenyltetrazole-5-ylthio); a sulfamoyl group (preferably a substituted or unsubstituted sulfamoyl group having 0 to 30 carbon atoms, for example, N-ethylsulfamoyl, N-(3-dodecyloxypropyl) sulfamoyl, N,N-dimethylsulfamoyl, N-acetyl sulfamoyl, N-benzoylsulfamoyl, or N—(N'-phenylcarbamoyl) sulfamoyl); a sulfo group; alkyl and aryl sulfinyl groups (preferably a substituted or unsubstituted alkyl sulfinyl group having 1 to 30 carbon atoms, and a substituted or unsubstituted aryl sulfinyl group having 6 to 30 carbon atoms, for example, methylsulfinyl, ethylsulfinyl, phenylsulfinyl, or p-methyl phenylsulfinyl); alkyl and aryl sulfonyl groups (preferably a substituted or unsubstituted alkyl sulfonyl group having 1 to 30 carbon atoms, and a substituted or unsubstituted aryl sulfonyl group having 6 to 30 carbon atoms, for example, methylsulfonyl, ethylsulfonyl, phenylsulfonyl, or p-methyl phenylsulfonyl); an acyl group (preferably, a formyl group, a substituted or unsubstituted alkylcarbonyl group having 2 to 30 carbon atoms, a substituted or unsubstituted arylcarbonyl group having 7 to 30 carbon atoms, and a substituted or unsubstituted heterocyclic carbonyl group having 4 to 30 carbon atoms in which a carbon atom is bonded with the carbonyl group, for example, acetyl, pivaloyl, 2-chloroacetyl, stearoyl, benzoyl, p-n-octyloxyphenyl carbonyl, 2-pyridylcarbonyl, or 2-furyl carbonyl); an aryloxycarbonyl group (preferably, a substituted or unsubstituted aryloxy carbonyl group having 7 to 30 carbon atoms, for example, phenoxycarbonyl, o-chlorophenoxycarbonyl, m-nitrophenoxycarbonyl, or p-t-butylphenoxycarbonyl); an alkoxycarbonyl group (preferably, a substituted or unsubstituted alkoxycarbonyl group having 2 to 30 carbon atoms, for example, methoxycarbonyl, ethoxycarbonyl, t-butoxycarbonyl, or n-octadecyl oxycarbonyl); a carbamoyl group (preferably a substituted or unsubstituted carbamoyl having 1 to 30 carbon atoms, for example, carbamoyl, N-methylcarbamoyl, N,N-dimethylcarbamoyl, N,N-di-n-octylcarbamoyl, or N-(methylsulfonyl)carbamoyl); aryl and heterocyclic azo groups (preferably a substituted or unsubstituted aryl azo group having 6 to 30 carbon atoms, and a substituted or unsubstituted heterocyclic azo group having 3 to 30 carbon atoms, for example, phenylazo, p-chlorophenyl azo, or 5-ethylthio-1,3,4-thiadiazole-2-yl azo); an imide group (preferably, N-succinimide, or N-phthalimide); a phosphino group (preferably, a substituted or unsubstituted phosphino group having 2 to 30 carbon atoms, for example, dimethylphosphino, diphenylphosphino, or methylphenoxy phosphino); a phosphinyl group (preferably, a substituted or unsubstituted phosphinyl group having 2 to 30 carbon atoms, for example, phosphinyl, dioctyloxyphosphinyl, or diethoxyphosphinyl); a phosphinyloxy group (preferably, a substituted or unsubstituted phosphinyloxy group having 2 to 30 carbon atoms, for example, diphenoxyphosphinyloxy or dioctyloxyphosphinyloxy); a phosphinylamino group (preferably a substituted or unsubstituted phosphinylamino group having 2 to 30 carbon atoms, for example, dimethoxyphosphinylamino or dimethylamino phosphinylamino); and a silyl group (preferably a substituted or unsubstituted silyl group having 3 to 30 carbon atoms, for example, trimethylsilyl, t-butyldimethylsilyl, or phenyldimethylsilyl).

Among the above functional groups, functional groups having a hydrogen atom may be further substituted with the above groups by removing the hydrogen atom. Examples of such functional groups include an alkylcarbonylaminosulfonyl group, an arylcarbonylaminosulfonyl group, an alkylsulfonyl aminocarbonyl group, an arylsulfonyl aminocarbonyl group, and the like. Examples thereof include methylsulfonylaminocarbonyl, p-methylphenyl sulfonyl aminocarbonyl, acetylamino sulfonyl, benzoylaminosulfonyl group, and the like.

The alkenyl group represented by $R_2$ and $R_3$ is a linear, branched, or cyclic substituted or unsubstituted alkenyl group. The alkenyl group has preferably 2 to 50 carbon atoms, more preferably 2 to 30 carbon atoms, and particularly preferably 2 to 20 carbon atoms. Preferable examples thereof include vinyl, allyl, prenyl, geranyl, oleyl, 2-cyclopentene-1-yl, 2-cyclohexene-1-yl, bicyclo[2.2.1]hept-2-en-1-yl, bicyclo[2.2.2]oct-2-en-4-yl, and the like. More preferable examples thereof include vinyl, allyl, prenyl, geranyl, oleyl, 2-cyclopentene-1-yl, and 2-cyclohexene-1-yl.

The alkenyl group represented by $R_2$ and $R_3$ may further include a substituent. Examples of the substituent include the substituents of the above-mentioned alkyl group represented by $R_2$ and $R_3$.

In addition, similarly to the above-mentioned alkyl group, the alkenyl group may include a linking group such as —CO—, —NH—, —O—, —S—, or a group composed of any combination of these.

The alkynyl group represented by $R_2$ and $R_3$ is a linear, branched, or cyclic substituted or unsubstituted alkynyl group. The alkynyl group has preferably 2 to 50 carbon atoms, more preferably 2 to 30 carbon atoms, and particularly preferably 2 to 20 carbon atoms. Preferable examples thereof include ethynyl, propargyl, and the like.

The alkynyl group represented by $R_2$ and $R_3$ may further include a substituent. Examples of the substituent include the substituents of the above-mentioned alkyl group represented by $R_2$ and $R_3$.

In addition, similarly to the above-mentioned alkyl group, the alkynyl group may include a linking group such as —CO—, —NH—, —O—, —S—, or a group composed of any combination of these.

The aryl group represented by $R_2$ and $R_3$ is a substituted or unsubstituted aryl group. The aryl group has preferably 6 to 50 carbon atoms, more preferably 6 to 30 carbon atoms, and particularly preferably 6 to 20 carbon atoms. Preferable examples thereof include phenyl, 2-methylphenyl, 3-methylphenyl, 4-methylphenyl, 2-ethylphenyl, 4-ethylphenyl, 2,4-dimethylphenyl, 2,6-dimethylphenyl, 2,4,6-trimethylphenyl, 1-naphthyl, 2-naphthyl, 2-chlorophenyl, 3-chlorophenyl, 4-chlorophenyl, 2-methoxyphenyl, 3-methoxyphenyl, 4-methoxyphenyl, 2-benzylphenyl, 4-benzylphenyl, 2-methylcarbonylphenyl, 4-methylcarbonylphenyl, and the like.

More preferable examples thereof include phenyl, 2-methylphenyl, 4-methylphenyl, 2-ethylphenyl, 4-ethylphenyl, 2,4-dimethylphenyl, 2,6-dimethylphenyl, 2,4,6-trimethylphenyl, 1-naphthyl, 2-naphthyl, 2-chlorophenyl, 4-chlorophenyl, 2-methoxyphenyl, 3-methoxyphenyl, 4-methoxyphenyl, 2-benzylphenyl, 4-benzylphenyl, and the like. Particularly preferable examples thereof include phenyl, 2-methylphenyl, 4-methylphenyl, 2,4-dimethylphenyl, 2,6-dimethylphenyl, 2,4,6-trimethylphenyl, 1-naphthyl, 2-naphthyl, 2-chlorophenyl, 4-chlorophenyl, 2-methoxyphenyl, 4-methoxyphenyl, 2-benzylphenyl, 4-benzylphenyl, and the like.

The aryl group represented by $R_2$ and $R_3$ may further include a substituent. Examples of the substituent include the substituents of the above-mentioned alkyl group represented by $R_2$ and $R_3$.

Each of $R_4$ and $R_5$ independently represents a hydrogen atom or a substituent.

Examples of the substituents represented by $R_4$ and $R_5$ may include the substituents of the above-mentioned alkyl group represented by $R_2$ and $R_3$. Preferable examples thereof include an alkyl group, an alkenyl group, an alkynyl group, an aryl group, and a group composed of any combination of these, and preferable examples of the respective groups include the examples of the above-mentioned $R_2$ and $R_3$.

The group represented by $R_4$ and $R_5$ may further include a substituent. Examples of the substituent include the substituents of the above-mentioned alkyl group represented by $R_2$ and $R_3$.

Each of $R_1$ and $R_6$ independently represents a hydrogen atom or a substituent.

Examples of the substituents represented by $R_1$ and $R_6$ may include the substituents of the above-mentioned alkyl group represented by $R_2$ and $R_3$. Preferable examples thereof include an alkyl group, an alkenyl group, an alkynyl group, an aryl group, and a group composed of any combination of these, and preferable examples of the respective groups include the examples of above-mentioned $R_2$ and $R_3$.

The group represented by $R_1$ and $R_6$ may further include a substituent. Examples of the substituent include the substituents of the above-mentioned alkyl group represented by $R_2$ and $R_3$.

n is an integer 0 to 5. However, when n is 0, P and Q are not concurrently OH, and not concurrently $CHR_4R_5$ either. When n is 2 or more, a plurality of atomic groups represented by $(CR_1=Y)$ may be the same or different from each other.

The compound represented by General Formula (1) may be a chain compound or a cyclic compound. When the compound is a cyclic compound, at least two of groups represented by $R_1$, $R_2$, $R_3$, $R_4$, $R_5$, and $R_6$ may be bonded to each other to form a ring.

When the two groups are bonded to each other, the coupling form may be any of a single bond, a double bond, and a triple bond.

At least one group of $R_1$ to $R_6$ contains a fluorine atom. Here, it is preferable that the fluorine atom is contained such that the content thereof is within the aforementioned range. The fluorine atom may substitute for any carbon atom of the compound represented by the General Formula (1).

Further, it is preferable that some or all hydrogen atoms contained in at least one group of $R_1$ to $R_6$ (preferably, some or all hydrogen atoms bonded to carbon atoms) are substituted with fluorine atoms. In this case, it is preferable that fluorine atoms are contained as a fluoroalkyl group (hereafter also referred to as "$R_f$ group") or a group substituted with the Re group. In other words, it is preferable that a fluoroalkyl group is contained in at least one group of $R_1$ to $R_6$.

It is preferable for the $R_f$ group to be a linear or branched perfluoroalkyl group having 1 to 14 carbon atoms or a substituent having 2 to 20 carbon atom and substituted with the linear or branched perfluoroalkyl group having 1 to 14 carbon atoms.

Examples of the linear or branched perfluoroalkyl group having 1 to 14 carbon atoms include $CF_3-$, $C_2F_5-$, $C_3F_7-$, $C_4F_9-$, $C_5F_{11}-$, $(CF_3)_2-CF-(CF_2)_2-$, $C_6F_{13}-$, $C_7F_{15}-$, $(CF_3)_2-CF-(CF_2)_4-$, $C_8F_{17}-$, $C_9F_{19}-$, $C_{10}F_{21}-$, $C_{12}F_{25}-$, and $C_{14}F_{29}-$.

Examples of the substituent having 2 to 20 carbon atom and substituted with the linear or branched perfluoroalkyl group having 1 to 14 carbon atoms include, but are not limited to, $(CF_3)_2CF(CF_2)_4(CH_2)_2-$, $C_9F_{19}CH_2-$, $C_8F_{17}CH_2CH(OH)CH_2-C_8F_{17}CH_2CH(OH)CH_2OC=OCH_2-$, $(CF_3)_2CF(CF_2)_4(CH_2)_2OC=OCH_2-$, $C_8F_{17}CH_2CH(OH)CH_2OC=O(CH_2)_2-$, $(CF_3)_2CF(CF_2)_4(CH_2)_2OC=O(CH_2)_2-$, $(CF_3)_2CFOC_2F_4-$, and $CF_3CF_2CF_2O[CF(CF_3)CF_2O]_4-CF(CF_3)-$.

It is preferable that 1 to 4 $R_f$ groups are contained in a molecule.

Two or more kinds of the compound represented by the General Formula (1) may be used.

It is preferable that the compound represented by General Formula (1) is at least one selected from the group consisting of compounds represented by General Formulae (6) to (21).

In addition, it is preferable that each of compounds represented by General Formulae (6) to (21) contains fluorine atoms in an amount satisfying the above-mentioned fluorine content.

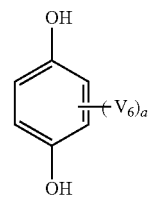

Formula (6)

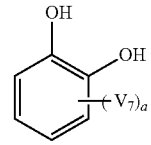

Formula (7)

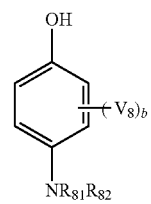

Formula (8)

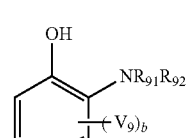

Formula (9)

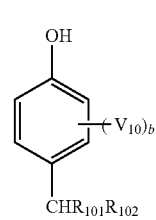

Formula (10)

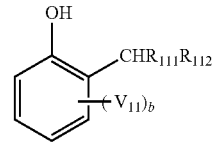

Formula (11)

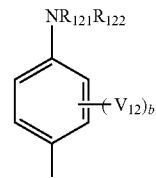

Formula (12)

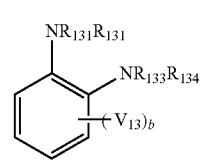

Formula (13)

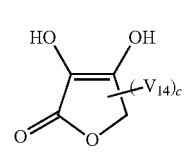

Formula (14)

-continued

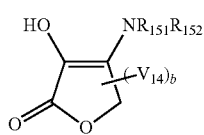
Formula (15)

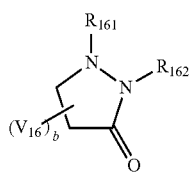
Formula (16)

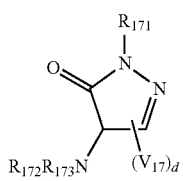
Formula (17)

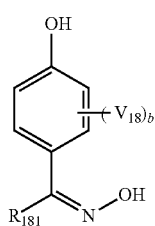
Formula (18)

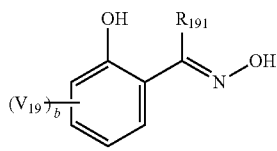
Formula (19)

R$_{201}$R$_{201}$N—NR$_{203}$R$_{204}$   Formula (20)

R$_{211}$R$_{212}$N—OH   Formula (21)

The compound represented by the General Formula (6) is an example of the compound of General Formula (1) in which P and Q are OH respectively, Y is CR$_6$, n is 2, and R$_1$ on the carbon atom adjacent to P and R$_6$ on the carbon atom adjacent to Q are bonded to each other to form a ring having a double bond.

In the General Formula (6), V$_6$ represents a substituent. a is an integer 1 to 4 (preferably 1 or 2, and more preferably 1). At least one V$_6$ contains a fluorine atom. In other words, in the case of one V$_6$, the fluorine atom is contained in the substituent, and, in the case of two or more V$_6$, the fluorine atom may be contained in at least one V$_6$. It is preferable that fluorine atoms are introduced by substituting some or all carbon atoms of at least one group represented by V$_6$ (preferably, some or all hydrogen atoms bonded to carbon atoms) with the fluorine atoms. In this case, it is preferable that the above R$_f$ group is contained in V$_6$.

The substituent represented by V$_6$ can be exemplified by the substituents of the above-mentioned alkyl group represented by R$_2$ and R$_3$ in the General Formula (1). When a plurality of V$_6$ are present in the General Formula (6), the respective groups may be the same or different from each other, and may be bonded to each other to form a ring.

Specific examples of the compound represented by the General Formula (6) are shown below. However, the present invention is not limited thereto. Hereinafter, the percentage described with the structural formula of each of the compounds is intended to represent the mass content of fluorine atoms (fluorine content).

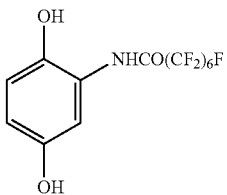
6-1

52.4%

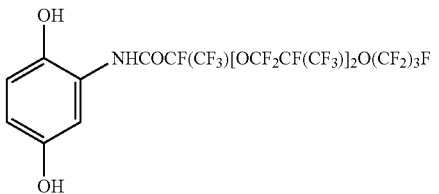
6-2

56.8%

The compound represented by the General Formula (7) is an example of the compound of General Formula (1) in which P and Q are OH respectively, Y is CR$_6$, n is 1, and R$_1$ on the carbon atom adjacent to P and R$_6$ on the carbon atom adjacent to Q are bonded to each other to form a ring.

In the General Formula (7), V$_7$ represents a substituent. a is an integer 1 to 4 (preferably 1 or 2, and more preferably 1). At least one V$_7$ contains a fluorine atom. In other words, in the case of one V$_7$, the fluorine atom is contained in the substituent, and, in the case of two or more V$_7$, the fluorine atom may be contained in at least one V$_7$. It is preferable that fluorine atoms are introduced by substituting some or all carbon atoms of at least one group represented by V$_7$ (preferably, some or all hydrogen atoms bonded to carbon atoms) with the fluorine atoms. In this case, it is preferable that the above R$_f$ group is contained in V$_7$.

The substituent represented by V$_7$ can be exemplified by the substituents of the above-mentioned alkyl group represented by R$_2$ and R$_3$ in the General Formula (1). When a plurality of V$_7$ are present in the General Formula (7), the respective groups may be the same or different from each other, and may be bonded to each other to form a ring.

Specific examples of the compound represented by the General Formula (7) are shown below. However, the present invention is not limited thereto.

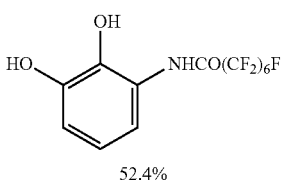
7-1

52.4%

-continued

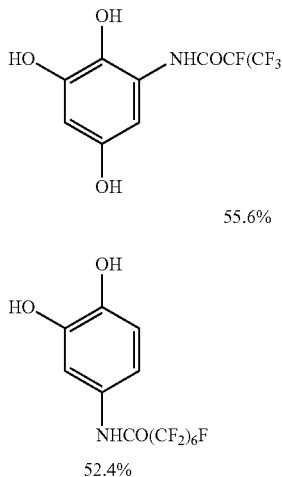

7-2

55.6%

7-3

52.4%

The compound represented by the General Formula (8) is an example of the compound of General Formula (1) in which P is OH, Q is $NR_2R_3$, Y is $CR_6$, n is 2, and $R_1$ on the carbon atom adjacent to P and $R_6$ on the carbon atom adjacent to Q are bonded to each other to form a ring having a double bond.

In the General Formula (8), $V_8$ represents a substituent. b is an integer 0 to 4 (preferably 1 or 2, and more preferably 1). The substituent represented by $V_8$ can be exemplified by the substituents of the above-mentioned alkyl group represented by $R_2$ and $R_3$ in the General Formula (1). When a plurality of $V_8$ are present in the General Formula (8), the respective groups may be the same or different from each other, and may be bonded to each other to form a ring.

Each of $R_{81}$ and $R_{82}$ independently represents a hydrogen atom or a group which can be substituted with a nitrogen atom. Preferable examples of the group which can be substituted with a nitrogen atom include the exemplary groups as referred to in the above-mentioned $R_2$ and $R_3$ of the General Formula (1).

At least one of $V_8$, $R_{81}$, and $R_{82}$ contains a fluorine atom. In this case, it is preferable that some or all hydrogen atoms of at least one group of $V_8$, $R_{81}$, and $R_{82}$ (preferably, some or all hydrogen atoms bonded to carbon atoms) are substituted with fluorine atoms. In addition, it is more preferable that the above $R_f$ group is contained in at least one of $V_8$, $R_{81}$, and $R_{82}$.

Further, in the case where a plurality of $V_8$ are contained in the compound, the fluorine atom is contained in at least one of the groups $V_8$ as well as the group $R_{81}$ and the group $R_{82}$.

Specific examples of the compound represented by the General Formula (8) are shown below. However, the present invention is not limited thereto.

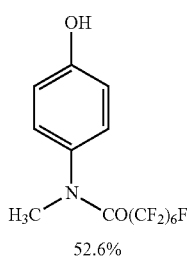

8-1

52.6%

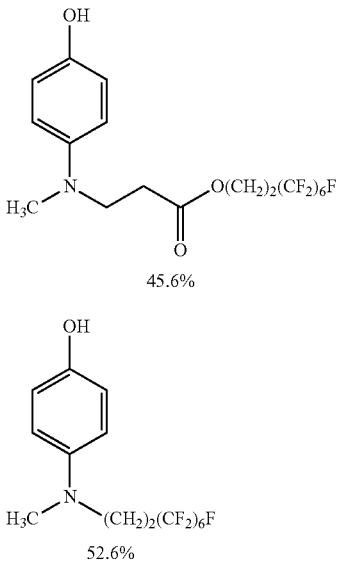

8-2

45.6%

8-3

52.6%

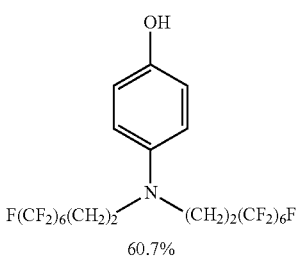

8-4

60.7%

The compound represented by the General Formula (9) is an example of the compound of General Formula (1) in which P is OH, Q is $NR_2R_3$, Y is $CR_6$, n is 1, and $R_1$ on the carbon atom adjacent to P and $R_6$ on the carbon atom adjacent to Q are bonded to each other to form a ring.

In the General Formula (9), $V_9$ represents a substituent. b is an integer 0 to 4 (preferably 1 or 2, and more preferably 1). The substituent represented by $V_9$ can be exemplified by the substituents of the above-mentioned alkyl group represented by $R_2$ and $R_3$ in the General Formula (1). When a plurality of $V_9$ are present in the General Formula (9), the respective groups may be the same or different from each other, and may be bonded to each other to form a ring.

Each of $R_{91}$ and $R_{92}$ independently represents a hydrogen atom or a group which can be substituted with a nitrogen atom. Preferable examples of the group which can be substituted with a nitrogen atom include the exemplary groups as referred to in the above-mentioned $R_2$ and $R_3$ of the General Formula (1).

At least one of $V_9$, $R_{91}$, and $R_{92}$ contains a fluorine atom. In this case, it is preferable that some or all hydrogen atoms of at least one group of $V_9$, $R_{91}$, and $R_{92}$ (preferably, some or all hydrogen atoms bonded to carbon atoms) are substituted with fluorine atoms. In addition, it is more preferable that the above $R_f$ group is contained in at least one of $V_9$, $R_{91}$, and $R_{92}$.

Further, in the case where a plurality of $V_9$ are contained in the compound, the fluorine atom is contained in at least one of the groups $V_9$ as well as the group $R_{91}$, and the group $R_{92}$.

Specific examples of the compound represented by the General Formula (9) are shown below. However, the present invention is not limited thereto.

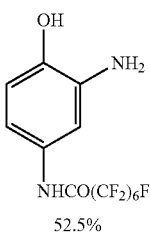

9-1

52.5%

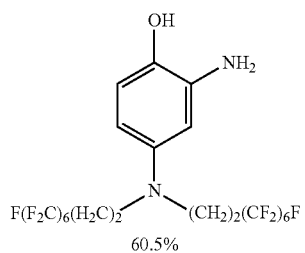

9-2

60.5%

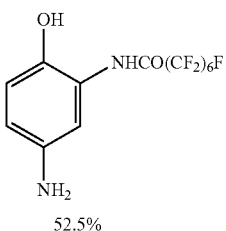

9-3

52.5%

The compound represented by the General Formula (10) is an example of the compound of General Formula (1) in which P is OH, Q is $CHR_4R_5$, Y is $CR_6$, n is 2, and $R_1$ on the carbon atom adjacent to P and $R_G$ on the carbon atom adjacent to Q are bonded to each other to form a ring having a double bond.

In the General Formula (10), $V_{10}$ represents a substituent. b is an integer 0 to 4 (preferably 1 or 2, and more preferably 1). The substituent represented by $V_{10}$ can be exemplified by the substituents of the above-mentioned alkyl group represented by $R_2$ and $R_3$ in the General Formula (1). When a plurality of $V_{10}$ are present in the General Formula (10), the respective groups may be the same or different from each other, and may be bonded to each other to form a ring.

Each of $R_{101}$ and $R_{102}$ independently represents a hydrogen atom or a substituent.

The substituent represented by $R_{101}$ and $R_{102}$ can be exemplified by the substituents of the above-mentioned alkyl group represented by $R_2$ and $R_3$. The substituent is preferably an alkyl group, an alkenyl group, an alkynyl group, or an aryl group. Preferable examples of the respective groups include the examples of the above-mentioned $R_2$ and $R_3$.

When $R_{101}$ and $R_{102}$ are substituents, each of these groups may further include a substituent. Examples of the substituent include the substituents of the above-mentioned alkyl group represented by $R_2$ and $R_3$ in the General Formula (1).

At least one of $V_{10}$, $R_{101}$, and $R_{102}$ contains a fluorine atom. In this case, it is preferable that some or all hydrogen atoms of at least one group of $V_{10}$, $R_{101}$, and $R_{102}$ (preferably, some or all hydrogen atoms bonded to carbon atoms) are substituted with fluorine atoms. In addition, it is preferable that the above $R_f$ group is contained in at least one of $V_{10}$, $R_{101}$, and $R_{102}$.

Further, in the case where a plurality of $V_{10}$ are contained in the compound, the fluorine atom is contained in at least one of the groups $V_{10}$ as well as the group $R_{101}$ and the group $R_{102}$.

Specific examples of the compound represented by the General Formula (10) are shown below. However, the present invention is not limited thereto.

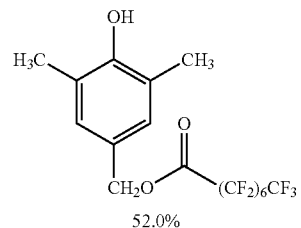

10-1

52.0%

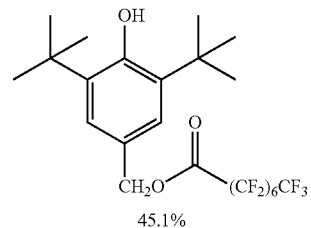

10-2

45.1%

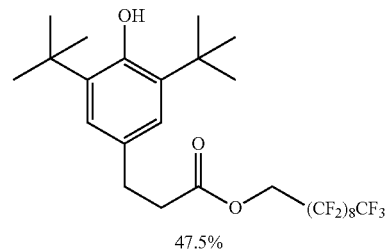

10-3

47.5%

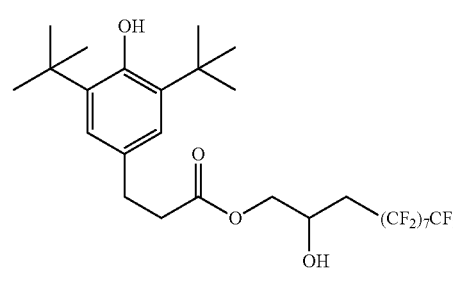

10-4

42.8%

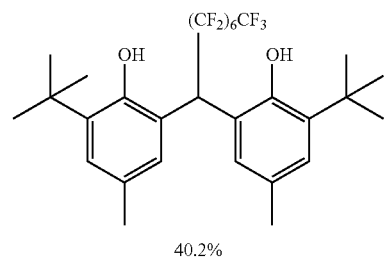

10-5

40.2%

10-6

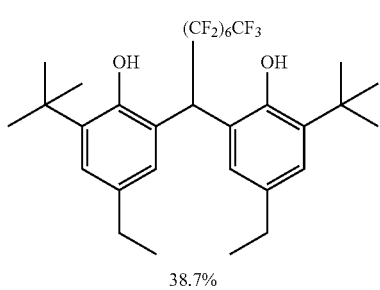

38.7%

The compound represented by the General Formula (11) is an example of the compound of General Formula (1) in which P is OH, Q is $CHR_4R_5$, Y is $CR_6$, n is 1, and $R_1$ on the carbon atom adjacent to P and $R_6$ on the carbon atom adjacent to Q are bonded to each other to form a ring.

In the General Formula (11), $V_{11}$ represents a substituent. b is an integer 0 to 4 (preferably 1 or 2, and more preferably 1). The substituent represented by $V_{11}$ can be exemplified by the substituents of the above-mentioned alkyl group represented by $R_2$ and $R_3$ in the General Formula (1). When a plurality of $V_{11}$ are present in the General Formula (11), the respective groups may be the same or different from each other, and may be bonded to each other to form a ring.

Each of $R_{111}$ and $R_{112}$ independently represents a hydrogen atom or a substituent.

The substituent represented by $R_{111}$ and $R_{112}$ can be exemplified by the substituents of the above-mentioned alkyl group represented by $R_2$ and $R_3$. The substituent is preferably an alkyl group, an alkenyl group, an alkynyl group, or an aryl group. Preferable examples of the respective groups include the examples of the above-mentioned $R_2$ and $R_3$.

When $R_{111}$ and $R_{112}$ are substituents, each of these groups may further include a substituent. Examples of the substituent include the substituents of the above-mentioned alkyl group represented by $R_2$ and $R_3$ in the General Formula (1).

At least one of $V_{11}$, $R_{111}$, and $R_{112}$ contains a fluorine atom. In this case, it is preferable that some or all hydrogen atoms of at least one group of $V_{11}$, $R_{111}$, and $R_{112}$ (preferably, some or all hydrogen atoms bonded to carbon atoms) are substituted with fluorine atoms. In addition, it is preferable that the above $R_f$ group is contained in at least one of $V_{11}$, $R_{111}$, and $R_{112}$.

Further, in the case where a plurality of $V_{11}$ are contained in the compound, the fluorine atom is contained in at least one of the groups $V_{11}$ as well as the group $R_{111}$ and the group $R_{112}$.

Specific examples of the compound represented by the General Formula (11) are shown below. However, the present invention is not limited thereto.

11-1

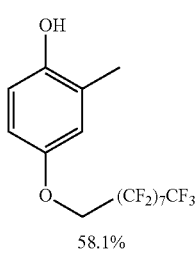

58.1%

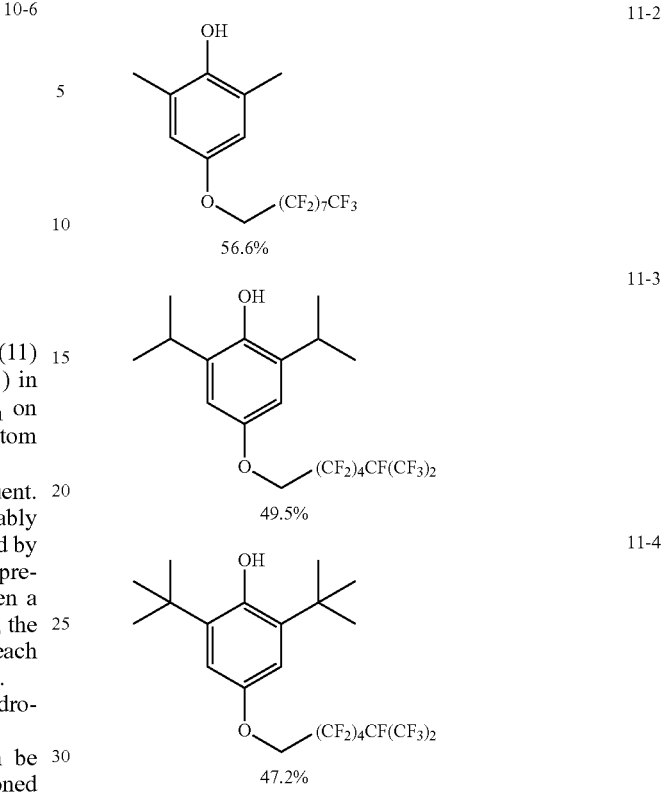

The compound represented by the General Formula (12) is an example of the compound of General Formula (1) in which P and Q are $NR_2R_3$ respectively, Y is $CR_6$, n is 2, and $R_1$ on the carbon atom adjacent to P and $R_6$ on the carbon atom adjacent to Q are bonded to each other to form a ring having a double bond.

In the General Formula (12), $V_{12}$ represents a substituent. b is an integer 0 to 4 (preferably 1 or 2, and more preferably 1). The substituent represented by $V_{12}$ can be exemplified by the substituents of the above-mentioned alkyl group represented by $R_2$ and $R_3$ in the General Formula (1). When a plurality of $V_{12}$ are present in the General Formula (12), the respective groups may be the same or different from each other, and may be bonded to each other to form a ring.

Each of $R_{121}$, $R_{122}$, $R_{123}$, and $R_{124}$ independently represents a hydrogen atom or a group which can be substituted with a nitrogen atom. Preferable examples of the group which can be substituted with a nitrogen atom include the exemplary groups as referred to in the above-mentioned $R_2$ and $R_3$ of the General Formula (1).

At least one of $V_{12}$, $R_{121}$, $R_{122}$, $R_{123}$, and $R_{124}$ contains a fluorine atom. In this case, it is preferable that some or all hydrogen atoms of at least one group of $V_{12}$, $R_{121}$, $R_{122}$, $R_{123}$, and $R_{124}$ (preferably, some or all hydrogen atoms bonded to carbon atoms) are substituted with fluorine atoms. In addition, it is more preferable that the above $R_f$ group is contained in at least one of $V_{12}$, $R_{121}$, $R_{122}$, $R_{123}$ and $R_{124}$.

Further, in the case where a plurality of $V_{12}$ are contained in the compound, the fluorine atom is contained in at least one of the groups $V_{12}$ as well as the group $R_{121}$, the group $R_{122}$, the group $R_{123}$ and the group $R_{124}$.

Specific examples of the compound represented by the General Formula (12) are shown below. However, the present invention is not limited thereto.

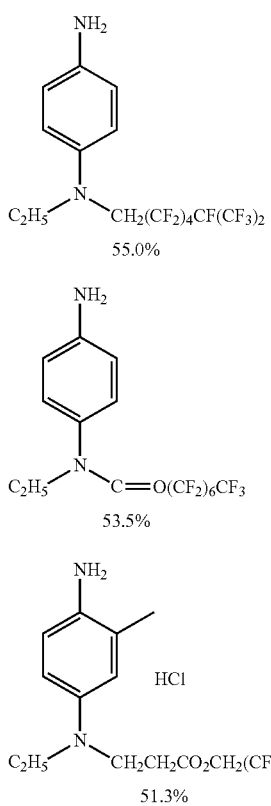

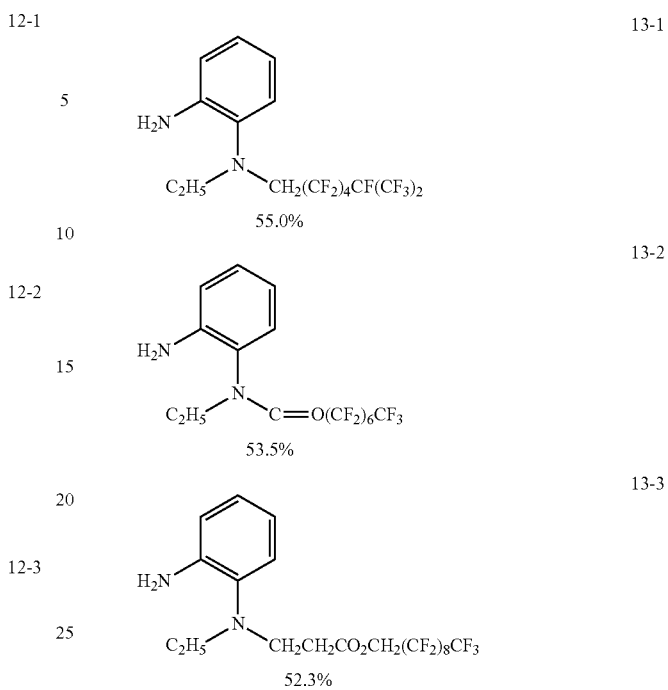

The compound represented by the General Formula (13) is an example of the compound of General Formula (1) in which P and Q are $NR_2R_3$ respectively, Y is $CR_6$, n is 1, and $R_1$ on the carbon atom adjacent to P and $R_6$ on the carbon atom adjacent to Q are bonded to each other to form a ring.

In the General Formula (13), $V_{13}$ represents a substituent. b is an integer 0 to 4 (preferably 1 or 2, and more preferably 1). The substituent represented by $V_{13}$ can be exemplified by the substituents of the above-mentioned alkyl group represented by $R_2$ and $R_3$ in the General Formula (1). When a plurality of $V_{13}$ are present in the General Formula (13), the respective groups may be the same or different from each other, and may be bonded to each other to form a ring.

Each of $R_{131}$, $R_{132}$, $R_{133}$, and $R_{134}$ independently represents a hydrogen atom or a group which can be substituted with a nitrogen atom. Preferable examples of the group which can be substituted with a nitrogen atom include the exemplary groups as referred to in the above-mentioned $R_2$ and $R_3$ of the General Formula (1).

At least one of $V_{13}$, $R_{131}$, $R_{132}$, $R_{133}$, and $R_{134}$ contains a fluorine atom. In this case, it is preferable that some or all hydrogen atoms of at least one group of $V_{13}$, $R_{131}$, $R_{132}$, $R_{133}$, and $R_{134}$ (preferably, some or all hydrogen atoms bonded to carbon atoms) are substituted with fluorine atoms. In addition, it is more preferable that the above $R_f$ group is contained in at least one of $V_{13}$, $R_{131}$, $R_{132}$, $R_{133}$, and $R_{134}$.

Further, in the case where a plurality of $V_{13}$ are contained in the compound, the fluorine atom is contained in at least one of the groups $V_{13}$ as well as the group $R_{131}$, the group $R_{132}$, the group $R_{133}$ and the group $R_{134}$.

Specific examples of the compound represented by the General Formula (13) are shown below. However, the present invention is not limited thereto.

The compound represented by the General Formula (14) is an example of the compound of General Formula (1) in which P and Q are OH respectively, Y is $CR_6$, n is 1, and $R_1$ on the carbon atom adjacent to P and $R_6$ on the carbon atom adjacent to Q are bonded to each other to form a ring.

In the General Formula (14), $V_{14}$ represents a substituent. c is an integer 1 or 2 (preferably 1). At least one $V_{14}$ contains a fluorine atom. In other words, in the case of one $V_{14}$, the fluorine atom is contained in the substituent, and, in the case of two or more $V_{14}$, the fluorine atom may be contained in at least one $V_{14}$. It is preferable that fluorine atoms are introduced by substituting some or all carbon atoms of at least one group represented by $V_{14}$ (preferably, some or all hydrogen atoms bonded to carbon atoms) with the fluorine atoms. In this case, it is more preferable that the above $R_f$ group is contained in $V_{14}$.

The substituent represented by $V_{14}$ can be exemplified by the substituents of the above-mentioned alkyl group represented by $R_2$ and $R_3$ in the General Formula (1). When a plurality of $V_{14}$ are present in the General Formula (14), the respective groups may be the same or different from each other, and may be bonded to each other to form a ring.

Specific examples of the compound represented by the General Formula (14) are shown below. However, the present invention is not limited thereto.

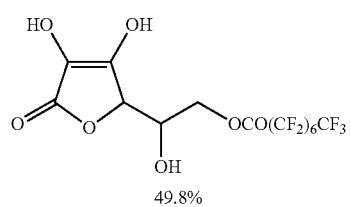

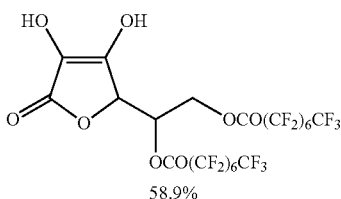

14-2

58.9%

The compound represented by the General Formula (15) is an example of the compound of General Formula (1) in which P is OH, Q is $NR_2R_3$, Y is $CR_6$, n is 1, and $R_1$ on the carbon atom adjacent to P and $R_6$ on the carbon atom adjacent to Q are bonded to each other to form a ring.

In the General Formula (15), $V_{15}$ represents a substituent. b is an integer 0 to 4 (preferably, 1 or 2, and more preferably 1). The substituent represented by $V_{15}$ can be exemplified by the substituents of the above-mentioned alkyl group represented by $R_2$ and $R_3$ in the General Formula (1). When a plurality of $V_{15}$ are present in the General Formula (15), the respective groups may be the same or different from each other, and may be bonded to each other to form a ring.

Each of $R_{151}$ and $R_{152}$ independently represents a hydrogen atom or a group which can be substituted with a nitrogen atom. Preferable examples of the group which can be substituted with a nitrogen atom include the exemplary groups as referred to in the above-mentioned $R_2$ and $R_3$ of the General Formula (1).

At least one of $V_{15}$, $R_{151}$, and $R_{152}$ contains a fluorine atom. In this case, it is preferable that some or all hydrogen atoms of at least one group of $V_{15}$, $R_{151}$, and $R_{152}$ (preferably, some or all hydrogen atoms bonded to carbon atoms) are substituted with fluorine atoms. In addition, it is preferable that the above $R_f$ is contained in at least one of $V_{15}$, $R_{151}$, and $R_{152}$.

Further, in the case where a plurality of $V_{15}$ are contained in the compound, the fluorine atom is contained in at least one of the groups $V_{15}$ as well as the group $R_{151}$ and the group $R_{152}$.

Specific examples of the compound represented by the General Formula (15) are shown below. However, the present invention is not limited thereto.

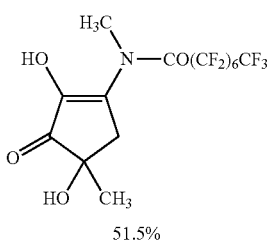

15-1

51.5%

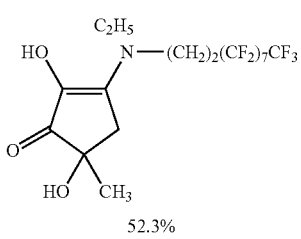

15-2

52.3%

The compound represented by the General Formula (16) is an example of the compound of General Formula (1) in which P and Q are $NR_2R_3$ respectively, n is 0, and $R_2$ and $R_3$ are bonded to each other to form a ring.

In the General Formula (16), $V_{16}$ represents a substituent. b is an integer 0 to 4 (preferably, 1 or 2, and more preferably 1). The substituent represented by $V_{16}$ can be exemplified by the substituents of the above-mentioned alkyl group represented by $R_2$ and $R_3$ in the General Formula (1). When a plurality of $V_{16}$ are present in the General Formula (16), the respective groups may be the same or different from each other, and may be bonded to each other to form a ring.

Each of $R_{161}$ and $R_{162}$ independently represents a hydrogen atom or a group which can be substituted with a nitrogen atom. Preferable examples of the group which can be substituted with a nitrogen atom include the exemplary groups as referred to in the above-mentioned $R_2$ and $R_3$ of the General Formula (1).

At least one of $V_{16}$, $R_{161}$, and $R_{162}$ contains a fluorine atom. In this case, it is preferable that some or all hydrogen atoms of at least one group of $V_{16}$, $R_{161}$, and $R_{162}$ (preferably, some or all hydrogen atoms bonded to carbon atoms) are substituted with fluorine atoms. In addition, it is preferable that the above $R_f$ group is contained in at least one of $V_{16}$, $R_{161}$, and $R_{162}$.

Further, in the case where a plurality of $V_{16}$ are contained in the compound, the fluorine atom is contained in at least one of the groups $V_{16}$ as well as the group $R_{161}$ and the group $R_{162}$.

Specific examples of the compound represented by the General Formula (16) are shown below. However, the present invention is not limited thereto.

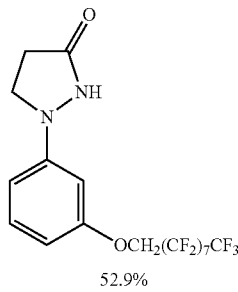
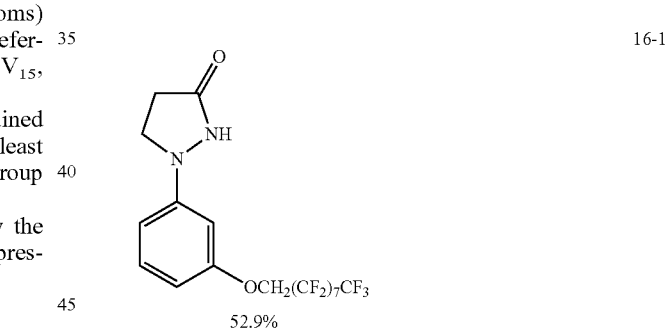

16-1

52.9%

16-2

49.6%

The compound represented by the General Formula (17) is an example of the compound of General Formula (1) in which P and Q are $NR_2R_3$ respectively, n is 0, and $R_2$ and $R_3$ are bonded to each other to form a ring.

In the General Formula (17), $V_{17}$ represents a substituent. d is 0 or 1. The substituent represented by $V_{17}$ can be exemplified by the substituents of the above-mentioned alkyl group represented by $R_2$ and $R_3$ in the General Formula (1). When a plurality of $V_{17}$ are present in the General Formula (17), the respective groups may be the same or different from each other, and may be bonded to each other to form a ring.

Each of $R_{171}$, $R_{172}$, and $R_{173}$ independently represents a hydrogen atom or a group which can be substituted with a nitrogen atom. Preferable examples of the group which can be substituted with a nitrogen atom include the exemplary groups as referred to in the above-mentioned $R_2$ and $R_3$ of the General Formula (1).

At least one of $V_{17}$, $R_{171}$, $R_{172}$, and $R_{173}$ contains a fluorine atom. In this case, it is preferable that some or all hydrogen atoms of at least one group of $V_{17}$, $R_{171}$, $R_{172}$, and $R_{173}$ (preferably, some or all hydrogen atoms bonded to carbon atoms) are substituted with fluorine atoms. In addition, it is preferable that the above $R_f$ group is contained in at least one of $V_{17}$, $R_{171}$, $R_{172}$, and $R_{173}$.

Further, in the case where a plurality of $V_{17}$ are contained in the compound, the fluorine atom is contained in at least one of the groups $V_{17}$ as well as the group $R_{171}$, the group $R_{172}$ and the group $R_{173}$.

Specific examples of the compound represented by the General Formula (17) are shown below. However, the present invention is not limited thereto.

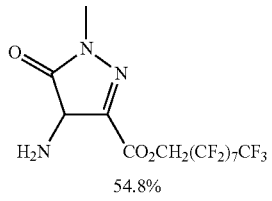

17-1

54.8%

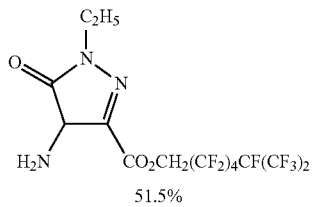

17-2

51.5%

The compound represented by the General Formula (18) is an example of the compound of General Formula (1) in which P and Q are OH respectively, Y is $CR_6$ and nitrogen atom, n is 3, and $R_1$ and $R_6$ are bonded to each other to form a ring.

In the General Formula (18), $V_{18}$ represents a substituent. b is an integer 0 to 4 (preferably 1 or 2, and more preferably 1). The substituent represented by $V_{18}$ can be exemplified by the substituents of the above-mentioned alkyl group represented by $R_2$ and $R_3$ in the General Formula (1). When a plurality of $V_{18}$ are present in the General Formula (18), the respective groups may be the same or different from each other, and may be bonded to each other to form a ring.

$R_{181}$ represents a hydrogen atom or a substituent. The substituent represented by $R_{181}$ can be exemplified by the substituents of the above-mentioned alkyl group represented by $R_2$ and $R_3$. The substituent is preferably an alkyl group, an alkenyl group, an alkynyl group, or an aryl group. Preferable examples of the respective groups include the examples of the above-mentioned $R_2$ and $R_3$.

When $R_{181}$ represents a substituent, this group may further include a substituent. Examples of the substituent include the substituents of the above-mentioned alkyl group represented by $R_2$ and $R_3$ in the General Formula (1).

At least one of $V_{18}$ and $R_{181}$ contains a fluorine atom. In this case, it is preferable that some or all hydrogen atoms of at least one group of $V_{18}$ and $R_{181}$ (preferably, some or all hydrogen atoms bonded to carbon atoms) are substituted with fluorine atoms. In addition, it is preferable that the above $R_f$ group is contained in at least one of $V_{18}$ and $R_{181}$.

Further, in the case where a plurality of $V_{18}$ are contained in the compound, the fluorine atom is contained in at least one of the groups $V_{18}$ and the group $R_{181}$.

Specific examples of the compound represented by the General Formula (18) are shown below. However, the present invention is not limited thereto.

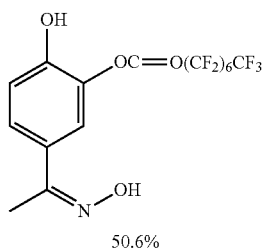

18-1

50.6%

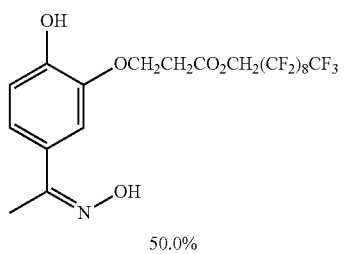

18-2

50.0%

The compound represented by the General Formula (19) is an example of the compound of General Formula (1) in which P and Q are OH respectively, Y is $CR_6$ and nitrogen atom, n is 2, and $R_1$ and $R_6$ are bonded to each other to form a ring.

In the General Formula (19), $V_{19}$ represents a substituent. b is an integer 0 to 4 (preferably 1 or 2, and more preferably 1). The substituent represented by $V_{19}$ can be exemplified by the substituents of the above-mentioned alkyl group represented by $R_2$ and $R_3$ in the General Formula (1). When a plurality of $V_{19}$ are present in the General Formula (19), the respective groups may be the same or different from each other, and may be bonded to each other to form a ring.

$R_{191}$ represents a hydrogen atom or a substituent. The substituent represented by $R_{191}$ can be exemplified by the substituents of the above-mentioned alkyl group represented by $R_2$ and $R_3$. The substituent is preferably an alkyl group, an alkenyl group, an alkynyl group, or an aryl group. Preferable examples of the respective groups include the examples of the above-mentioned $R_2$ and $R_3$.

When $R_{191}$ represents a substituent, this group may further include a substituent. Examples of the substituent include the substituents of the above-mentioned alkyl group represented by $R_2$ and $R_3$ in the General Formula (1).

At least one of $V_{19}$ and $R_{191}$ contains a fluorine atom. In this case, it is preferable that some or all hydrogen atoms of at least one group of $V_{19}$ and $R_{191}$ (preferably, some or all hydrogen atoms bonded to carbon atoms) are substituted with fluorine atoms. In addition, it is preferable that the above $R_f$ group is contained in at least one of $V_{19}$ and $R_{191}$.

Further, in the case where a plurality of $V_{19}$ are contained in the compound, the fluorine atom is contained in at least one of the groups $V_{19}$ and the group $R_{191}$.

Specific examples of the compound represented by the General Formula (19) are shown below. However, the present invention is not limited thereto.

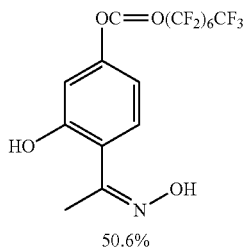

19-1

50.6%

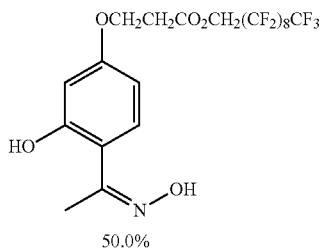

19-2

50.0%

The compound represented by the General Formula (20) is an example of the compound of General Formula (1) in which P and Q are $NR_2R_3$ respectively, and n is 0.

In the General Formula (20), each of $R_{201}$, $R_{202}$, $R_{203}$, and $R_{204}$ independently represents a hydrogen atom or a group which can be substituted with a nitrogen atom. Preferable examples of the group which can be substituted with a nitrogen atom include the exemplary groups as referred to in the above-mentioned $R_2$ and $R_3$ of the General Formula (1).

At least one of $R_{201}$, $R_{202}$, $R_{203}$, and $R_{204}$ contains a fluorine atom. In this case, it is preferable that some or all hydrogen atoms of at least one group of $R_{201}$, $R_{202}$, $R_{203}$, and $R_{204}$ (preferably, some or all hydrogen atoms bonded to carbon atoms) are substituted with fluorine atoms. In addition, it is preferable that the above $R_f$ group is contained in at least one of $R_{201}$, $R_{202}$, $R_{203}$, and $R_{204}$.

Specific examples of the compound represented by the General Formula (20) are shown below. However, the present invention is not limited thereto.

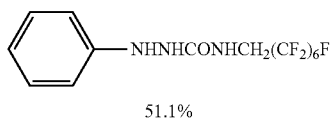

20-1

51.1%

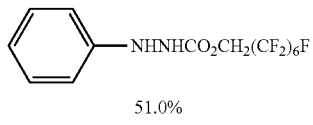

20-2

51.0%

The compound represented by the General Formula (21) is an example of the compound of General Formula (1) in which P is $NR_2R_3$, Q is OH, and n is 0.

In the General Formula (21), each of $R_{211}$ and $R_{212}$ independently represents a hydrogen atom or a group which can be substituted with a nitrogen atom. Preferable examples of the group which can be substituted with a nitrogen atom include the exemplary groups as referred to in the above-mentioned $R_2$ and $R_3$ of the General Formula (1).

At least one of $R_{211}$ and $R_{212}$ contains a fluorine atom. In this case, it is preferable that some or all hydrogen atoms of at least one group of $R_{211}$ and $R_{212}$ (preferably, some or all hydrogen atoms bonded to carbon atoms) are substituted with fluorine atoms. In addition, it is preferable that the above $R_f$ is contained in at least one of $R_{211}$ and $R_{212}$.

Specific examples of the compound represented by the General Formula (21) are shown below. However, the present invention is not limited thereto.

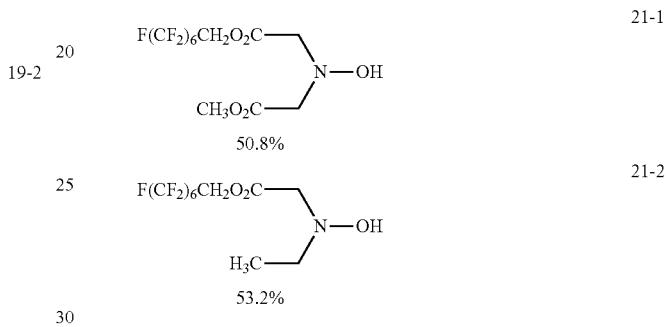

21-1

50.8%

21-2

53.2%

Meanwhile, as the most preferred example of the compound represented by the General Formula (1), there is mentioned a compound represented by General Formula (X1) below.

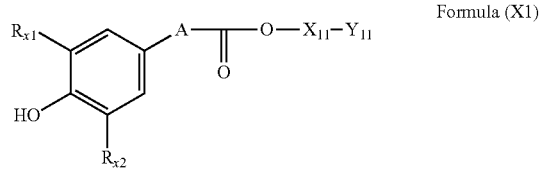

Formula (X1)

Each of $R_{x1}$ and $R_{x2}$ independently represents an alkyl group having 1 to 12 carbon atoms. In terms of the ion migration inhibiting function being more excellent, the number of carbon atoms in the alkyl group is preferably 1 to 8, more preferably 1 to 6, and particularly preferably 1 to 5. Specific examples of the preferable alkyl group include methyl, ethyl, n-propyl, isopropyl, t-butyl, isobutyl, 2,2-dimethyl propyl, hexyl, cyclohexyl, and the like.

A represents an alkylene group having 1 to 2 carbon atoms. A is preferably —$CH_2$— or —$CH_2CH_2$—, and more preferably —$CH_2CH_2$—.

$X_{11}$ represents an alkylene group having 1 to 3 carbon atoms which may contain a hydroxyl group. $X_{11}$ is preferably —$CH_2$—, —$CH_2CH_2$—, —$CH_2CH(CH_3)$—, —$CH_2CH_2CH_2$—, —$CH_2CH(OH)$ $CH_2$— or —$CH_2CH(CH_2OH)$—, more preferably —$CH_2$—, —$CH_2CH_2$—, —$CH_2CH(OH)CH_2$— or —$CH_2CH_2CH_2$—, and particularly preferably —$CH_2$— or —$CH_2CH_2$—.

$Y_{11}$ represents a linear perfluoroalkyl group having 4 to 12 carbon atoms. Preferred examples of the perfluoroalkyl group include $C_4F_9$—, $C_5F_{11}$—, $C_6F_{13}$—, $C_7F_{15}$—, $C_8F_{17}$—, $C_9F_{19}$—, $C_{10}F_{21}$—, and $C_{12}F_{25}$—. When the number of carbon atoms is within the above range, the ion migration inhibiting function is more excellent.

$R_{x1}$, $R_{x2}$, A, and $X_{11}$ may have the above-mentioned substituent.

(Compound Represented by General Formula (2))

Next, a compound represented by General Formula (2) will be described.

$$R_7-C(=O)-H \qquad \text{General Formula (2)}$$

In the present invention, the compound represented by the General Formula (2) also contains a compound exhibiting reducing properties due to the existence of equilibrium between aldehyde and hemiacetal (aldose or the like), or a compound capable of forming aldheyde by the isomerization between aldose and ketose through the Lobry de Bruyn-van Ekenstein transformation reaction (fructose or the like).

In the General Formula (2), $R_7$ represents an alkyl group, an alkenyl group, an alkynyl group, an aryl group, a heterocyclic group, or a group composed of any combination of these.

When $R_7$ represents an alkyl group, an alkenyl group, an alkynyl group, or an aryl group, preferred examples of the respective groups include the examples of the above-mentioned $R_2$ and $R_3$.

When $R_7$ represents a heterocyclic group, $R_7$ is preferably a monovalent group obtained by removing one hydrogen atom from a 5- or 6-membered substituted or unsubstituted aromatic or non-aromatic heterocyclic compound, and more preferably a 5- or 6-membered aromatic or non-aromatic heterocyclic group having 3 to 30 carbon atoms. Preferred examples thereof include 2-furanyl, 2-thienyl, 2-pyrimidinyl, 2-benzothiazolyl, 2-benzoxazolyl, 2-imidazolyl, 4-imidazolyl, triazolyl, benzotriazolyl, thiadiazolyl, pyrrolidinyl, piperidinyl, imidazolidinyl, pyrazolidinyl, morpholinyl, tetrahydrofuranyl, tetrahydrothienyl, and the like.

$R_7$ is more preferably an alkyl group, an alkenyl group, an alkynyl group, or an aryl group, and particularly preferably an alkyl or an aryl group.

The alkyl group, alkenyl group, alkynyl group, aryl group or heterocyclic group represented by $R_7$ may further include a substituent. Examples of the substituent include the substituents of the above-mentioned alkyl group represented by $R_2$ and $R_3$ in the General Formula (1).

Some or all hydrogen atoms in the group represented by $R_7$ (preferably, some or all hydrogen atoms bonded to carbon atoms) are substituted with fluorine atoms. In this case, it is preferable that the above $R_f$ group is contained in $R_7$. Further, it is preferable for the compound represented by the General Formula (2) to contain fluorine atoms in an amount satisfying the above-mentioned fluorine content.

Moreover, a hydroxyl group or a group represented by —COO— may be contained in the group represented by $R_7$.

Specific examples of the compound represented by the General Formula (2) are shown below. However, the present invention is not limited thereto.

2-1

F₃C(F₂C)₆OCO—CH(OH)—CHO 58.6%

2-2

(pentafluorophenyl-CHO)

48.4%

2-3

(acetylated sugar structure with CF₃(CF₂)₆ ester and isopropyl ether)

38.3%

(Compound Represented by General Formula (3))

Next, a compound represented by General Formula (3) will be described.

$$R_9O-CH(OR_8)-OR_{10} \qquad \text{Formula (3)}$$

In the General Formula (3), each of the groups represented by $R_8$, $R_9$ and $R_{10}$ independently represents an alkyl group, an alkenyl group, an alkynyl group, an aryl group, a heterocyclic group, or a group composed of any combination of these. Preferred examples of the alkyl group, alkenyl group, alkynyl group, aryl group, and heterocyclic group include the examples of the above-mentioned $R_2$ and $R_3$ in the General Formula (1).

Each of the groups represented by $R_8$, $R_9$, and $R_{10}$ may further include a substituent. Examples of the substituent include the substituents of the above-mentioned alkyl group represented by $R_2$ and $R_3$ in the General Formula (1).

Some or all hydrogen atoms of at least one group of $R_8$ to $R_{10}$ (preferably, some or all hydrogen atoms bonded to carbon atoms) are substituted with fluorine atoms. In this case, it is preferable that the above $R_f$ group is contained in at least one group of $R_8$ to $R_{10}$. Further, it is preferable that the compound represented by the General Formula (3) contains fluorine atoms in an amount satisfying the above-mentioned fluorine content.

A specific example of the compound represented by the General Formula (3) is shown below. However, the present invention is not limited thereto.

3-1

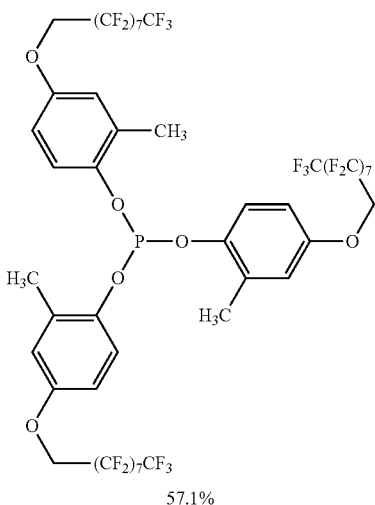

57.1%

(Compound Represented by General Formula (4))
Next, a compound represented by General Formula (4) will be described.

Formula (4)

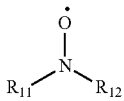

In the General Formula (4), each of $R_{11}$ and $R_{12}$ independently represents an alkyl group, an alkenyl group, an alkynyl group, an aryl group, a heterocyclic group, or a group composed of any combination of these. Preferred examples of the alkyl group, alkenyl group, alkynyl group, aryl group, and heterocyclic group include the examples of the above-mentioned $R_2$ and $R_3$ in the General Formula (1).

Each of the groups represented by $R_{11}$ and $R_{12}$ may further include a substituent. Examples of the substituent may include the substituents of the above-mentioned alkyl group represented by $R_2$ and $R_3$ in the General Formula (1).

Some or all hydrogen atoms of at least one group of $R_{11}$ to $R_{12}$ (preferably, some or all hydrogen atoms bonded to carbon atoms) are substituted with fluorine atoms. In this case, it is preferable that the above $R_f$ group is contained in at least one group of $R_{11}$ to $R_{12}$. Further, it is preferable that the compound represented by the General Formula (4) contains fluorine atoms in an amount satisfying the above-mentioned fluorine content.

Specific examples of the compound represented by the General Formula (4) are shown below. However, the present invention is not limited thereto.

4-1

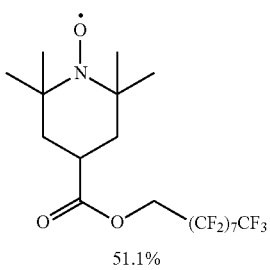

51.1%

4-2

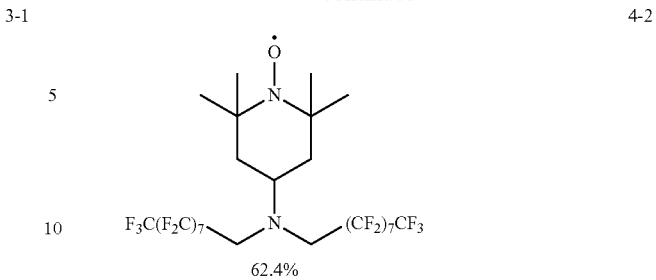

62.4%

(Compound Represented by General Formula (5))
Next, a compound represented by General Formula (5) will be described.

Z—SH          General Formula (5)

In the General Formula (5), Z represents an alkyl group, an alkenyl group, an alkynyl group, an aryl group, a heterocyclic group, or a group composed of any combination of these. Preferred examples of the alkyl group, alkenyl group, alkynyl group, aryl group, and heterocyclic group include the examples of the above-mentioned $R_2$ and $R_3$ in the General Formula (1).

The group represented by Z may further include a substituent. Examples of the substituent include the substituents of the above-mentioned alkyl group represented by $R_2$ and $R_3$ in the General Formula (1).

Some or all hydrogen atoms of the group represented by Z (preferably, some or all hydrogen atoms bonded to carbon atoms) are substituted with fluorine atoms. In this case, it is preferable that the above $R_f$ group is contained in Z. Further, it is preferable that the compound represented by the General Formula (5) contains fluorine atoms in an amount satisfying the above-mentioned fluorine content.

The compound represented by the General Formula (5) is preferably a compound represented by any of General Formulae (51) to (54).

Formula (51)

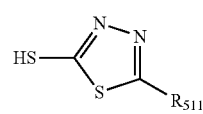

Formula (52)

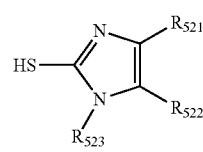

Formula (53)

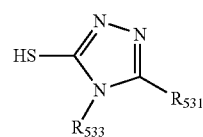

Formula (54)

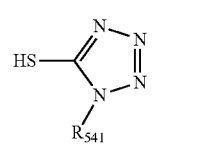

In the General Formula (51), $R_{511}$ represents a substituent containing a fluorine atom.

The substituent can be exemplified by the substituents of the above-mentioned alkyl group represented by $R_2$ and $R_3$ in the General Formula (1). The group represented by $R_{511}$ may further include a substituent. Examples of the substituent include the substituents of the above-mentioned alkyl group represented by $R_2$ and $R_3$ in the General Formula (1).

In addition, $R_{511}$ contains a fluorine atom. In this case, some or all hydrogen atoms of $R_{511}$ (preferably, some or all hydrogen atoms bonded to carbon atoms) are substituted with fluorine atoms. Further, it is preferable that the above $R_f$ group is contained in $R_{511}$.

Specific examples of the compound represented by the General Formula (51) are shown below. However, the present invention is not limited thereto.

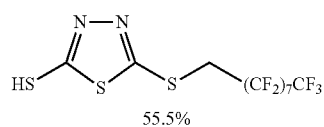
55.5%
51-1

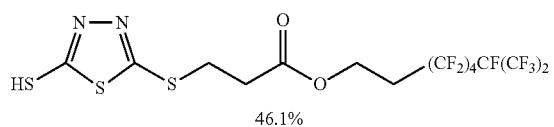
46.1%
51-2

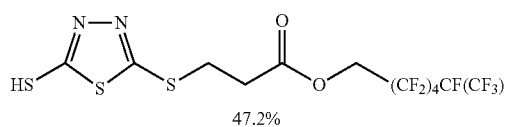
47.2%
51-3

In the General Formula (52), each of $R_{521}$ and $R_{522}$ independently represents a hydrogen atom or a substituent. $R_{523}$ represents a hydrogen atom or a group which can be substituted with a nitrogen atom. Preferable examples of the group which can be substituted with a nitrogen atom include the exemplary groups as referred to in the above-mentioned $R_2$ and $R_3$ of the General Formula (1). Further, the substituent can be exemplified by the substituents of the above-mentioned alkyl group represented by $R_2$ and $R_3$ in the General Formula (1). $R_{521}$, $R_{522}$, and $R_{523}$ may be the same or different from each other, and may be bonded to each other to form a ring.

At least one group of $R_{521}$, $R_{522}$, and $R_{523}$ contains a fluorine atom. In this case, it is preferable that some or all hydrogen atoms of at least one group of $R_{521}$, $R_{522}$, and $R_{523}$ (preferably, some or all hydrogen atoms bonded to carbon atoms) are substituted with fluorine atoms. In addition, it is more preferable that the above $R_f$ group is contained in at least one group of $R_{521}$, $R_{522}$, and $R_{523}$.

Specific examples of the compound represented by the General Formula (52) are shown below. However, the present invention is not limited thereto.

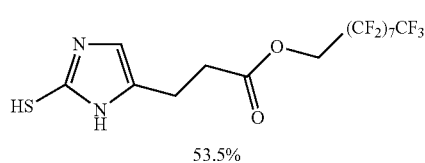
53.5%
52-1

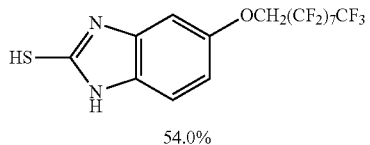
54.0%
52-2

In the General Formula (53), $R_{531}$ represents a hydrogen atom or a substituent. $R_{532}$ represents a hydrogen atom or a group which can be substituted with a nitrogen atom. Preferable examples of the group which can be substituted with a nitrogen atom include the exemplary groups as referred to in the above-mentioned $R_2$ and $R_3$ of the General Formula (1). Further, the substituent can be exemplified by the substituents of the above-mentioned alkyl group represented by $R_2$ and $R_3$ in the General Formula (1). $R_{531}$ and $R_{532}$ may be the same or different from each other, and may be bonded to each other to form a ring.

At least one group of $R_{531}$ and $R_{532}$ contains a fluorine atom. In this case, it is preferable that some or all hydrogen atoms of at least one group of $R_{531}$ and $R_{532}$ (preferably, some or all hydrogen atoms bonded to carbon atoms) are substituted with fluorine atoms. In addition, it is more preferable that the above $R_f$ group is contained in at least one group of $R_{531}$ and $R_{532}$.

Specific examples of the compound represented by the General Formula (53) are shown below. However, the present invention is not limited thereto.

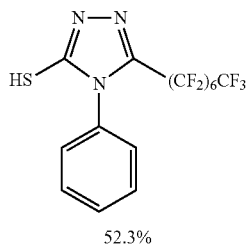
52.3%
53-1

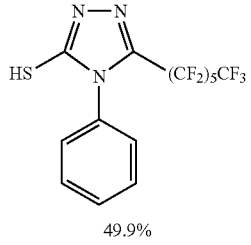
49.9%
53-2

In the General Formula (54), $R_{541}$ represents a fluorine-containing group which can be substituted with a nitrogen atom. Preferable examples of the group which can be substituted with a nitrogen atom include the exemplary groups as referred to in the above-mentioned $R_2$ and $R_3$ of the General Formula (1).

$R_{541}$ contains a fluorine atom. In this case, it is preferable that some or all hydrogen atoms of $R_{541}$ (preferably, some or all hydrogen atoms bonded to carbon atoms) are substituted with fluorine atoms. In addition, it is more preferable that the above $R_f$ group is contained in $R_{541}$.

Specific examples of the compound represented by the General Formula (54) are shown below. However, the present invention is not limited thereto.

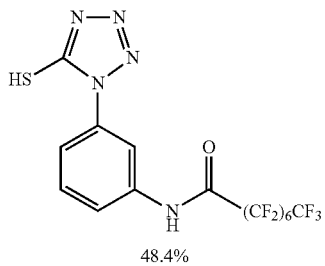

54-1

48.4%

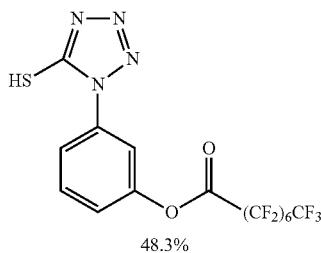

54-2

48.3%

Meanwhile, as the most preferred example of the compound represented by the General Formula (5), there is mentioned a compound represented by the following General Formula (Y).

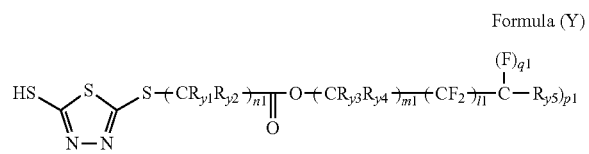

Formula (Y)

In the General Formula (Y), each of $R_{y1}$ and $R_{y2}$ independently represents a hydrogen atom or an alkyl group. n1 is 1 or 2, and preferably 2. When n1 is 2, a plurality of unit structures represented by $CR_{y1}R_{y2}$ may be the same or different from each other.

When each of $R_{y1}$ and $R_{y2}$ represents an alkyl group, the alkyl group preferably has 1 to 30 carbon atoms, more preferably 1 to 15 carbon atoms, and particularly preferably 1 to 6 carbon atoms. Preferable examples thereof include methyl, ethyl, n-propyl, isopropyl, t-butyl, n-octyl, eicosyl, chloromethyl, hydroxymethyl, aminoethyl, N,N-dimethylaminomethyl, 2-chloroethyl, 2-cyanoethyl, 2-hydroxyethyl, 2-(N,N-dimethylamino)ethyl, 2-ethylhexyl, and the like.

The structure represented by $(CR_{y1}R_{y2})_{n1}$ is preferably —CH$_2$—, —CH$_2$CH$_2$— or —CH$_2$CH(CH$_3$)—, more preferably —CH$_2$CH$_2$— or —CH$_2$CH(CH$_3$)—, and particularly preferably —CH$_2$CH$_2$—.

Each of $R_{y3}$ and $R_{y4}$ independently represents a hydrogen atom or a substituent. m1 is an integer 1 to 6. When m1 is 2 or more, a plurality of unit structures represented by $CR_{y3}R_{y4}$ may be the same or different from each other. Further, $R_{y3}$ and $R_{y4}$ may be bonded to each other to form a ring. Examples of the substituent may include the substituents of the above-mentioned alkyl group represented by $R_2$ and $R_3$ in the General Formula (1).

The structure represented by $(CR_{y3}R_{y4})_{m1}$ is preferably —CH$_2$—, —CH$_2$CH$_2$—, —CH$_2$CH(CH$_3$)—, CH$_2$CH$_2$CH$_2$—, —CH$_2$CH(OH)CH$_2$— or —CH$_2$CH (CH$_2$OH)—, more preferably —CH$_2$—, —CH$_2$CH$_2$—, —CH$_2$CH(OH)CH$_2$— or —CH$_2$CH$_2$CH$_2$—, and particularly preferably —CH$_2$— or —CH$_2$CH$_2$—.

l1 is an integer 1 to 6. In this case, in terms of compatibility with fluorine-based resin being excellent, l1 is preferably 2 to 5, and more preferably 3 or 4.

q1 represents 0 or 1, p1 represents 2 or 3, and p1+q1 represents 3. In terms of compatibility with fluorine-based resin being excellent, it is preferable that q1 is 1 and p1 is 2.

$R_{y5}$ represents a perfluoroalkyl group having 1 to 14 carbon atoms. The perfluoroalkyl group may be either linear or branched.

Examples of the linear or branched perfluoroalkyl group having 1 to 14 carbon atoms include CF$_3$—, C$_2$F$_5$—, C$_3$F$_7$—, C$_4$F$_9$—, C$_5$F$_{11}$—, C$_6$F$_{13}$—, C$_7$F$_{15}$—, C$_8$F$_{17}$—, C$_9$F$_{19}$—, C$_{10}$F$_{21}$—, C$_{12}$F$_{25}$—, C$_{14}$F$_{29}$—, and the like.

(Compound Represented by General Formula (22))

Next, a compound represented by General Formula (22) will be described. Here, it is preferable for the compound represented by formula (22) to contain fluorine atoms in an amount satisfying the above-mentioned fluorine content.

Formula (22)

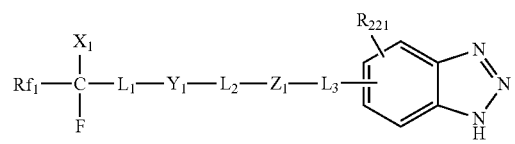

In the General Formula (22), Rf$_1$ represents a fluoroalkyl group having 22 or less carbon atoms, which may have an ethereal oxygen atom and in which at least one hydrogen atom is substituted with a fluorine atom, or represents a fluorine atom.

Hydrogen atoms in the perfluoroalkyl group may be substituted with a halogen atom other than the fluorine atom. It is preferable that the halogen atom other than the fluorine atom is a chlorine atom. The ethereal oxygen atom (—O—) may be present in the carbon-carbon bond ring of the fluoroalkyl group, or may be present at the terminal of the fluoroalkyl group. The structure of the fluoroalkyl group may be a linear structure, a branched structure, a cyclic structure or a partially cyclic structure, and among these, a linear structure is preferable.

Rf$_1$ is preferably a perfluoroalkyl group or a polyfluoroalkyl group containing one hydrogen atom, and particularly preferably a perfluoroalkyl group (optionally having an ethereal oxygen atom).

As Rf$_1$, a perfluoroalkyl group having 4 to 6 carbon atoms, or a perfluoroalkyl group having 4 to 9 carbon atoms and containing an ethereal oxygen atom is preferable.

Specific examples of Rf$_1$ include —CF$_3$, —CF$_2$CF$_3$, —CF$_2$CHF$_2$, —(CF$_2$)$_2$CF$_3$, —(CF$_2$)$_3$CF$_3$, —(CF2)$_4$CF$_3$, —(CF$_2$)$_5$CF$_3$, —(CF$_2$)$_6$CF$_3$, —(CF$_2$)$_7$CF$_3$, —(CF$_2$)$_8$CF$_3$, —(CF$_2$)$_9$CF$_3$, —(CF$_2$)$_{11}$CF$_3$, —(CF$_2$)$_{15}$CF$_3$, —CF(CF$_3$)O (CF$_2$)$_5$CF$_3$, —CF$_2$O(CF$_2$CF$_2$O)$_p$CF$_3$ (p is an integer 1 to 8), —CF(CF$_3$)O(CF$_2$CF(CF$_3$)O)$_q$C$_6$F$_{13}$ (q is an integer 1 to 4), and —CF(CF$_3$)O(CF$_2$CF(CF$_3$)O)$_r$C$_3$F$_7$ (r is an integer 1 to 5).

Particularly preferably, Rf$_1$ is —(CF$_2$)CF$_3$ or —(CF$_2$)$_5$CF$_3$.

X$_1$ represents a hydrogen atom, a fluorine atom, or a trifluoromethyl group. Among them, a fluorine atom or trifluoromethyl group is preferable.

$L_1$ represents a single bond or an alkylene group having 1 to 6 carbon atoms. An alkylene group having 1 to 2 carbon atoms is preferable.

$L_2$ represents a single bond or an alkylene group having 1 to 6 carbon atoms which may be substituted with a hydroxyl group or a fluorine atom. Among them, an alkylene group having 1 to 2 carbon atoms is preferable.

$L_3$ represents a single bond or an alkylene group having 1 to 6 carbon atoms. Among them, a single bond or an alkylene group having 1 to 2 carbon atoms is preferable.

Each of $Y_1$ and $Z_1$ independently represents a single bond, —$CO_2$—, —CO—, —OC(=O)O—, —$SO_3$—, —$CONR_{222}$—, —NHCOO—, —O—, —S—, —$SO_2NR_{222}$—, or —$NR_{222}$—. $R_{222}$ represents a hydrogen atom or an alkyl group having 1 to 5 carbon atoms.

Among them, —$CO_2$—, —O—, —S—, —$SO_2NR_{222}$—, or —$CONR_{222}$— is preferable.

$R_{221}$ represents a hydrogen atom, a linear or branched alkyl group having 1 to 8 carbon atoms, or $Rf_1$—$CFX_1$-$L_1$-$Y_1$-$L_2$-$Z_1$-$L_3$-.

It should be noted that, when both $Y_1$ and $Z_1$ are other than a single bond, $L_2$ represents an alkylene group having 1 to 6 carbon atoms which may be substituted with a fluorine atom.

Specific examples of the compound represented by the General Formula (22) are shown below. However, the present invention is not limited thereto.

1-1
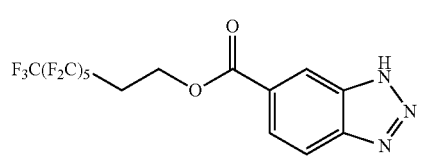

1-2
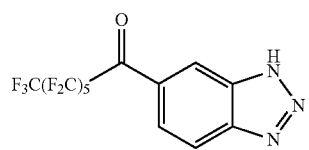

1-3
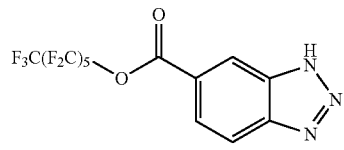

1-4
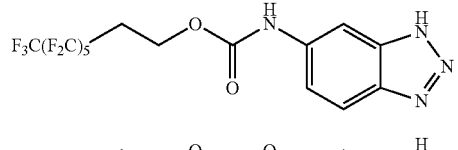

1-5
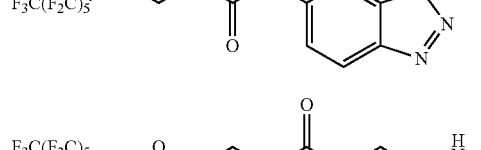

1-6
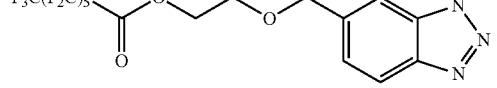

1-7
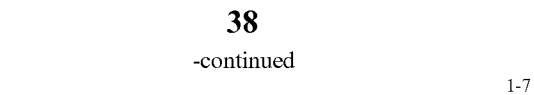

1-8
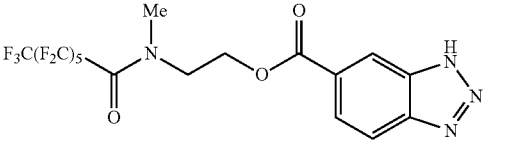

1-9
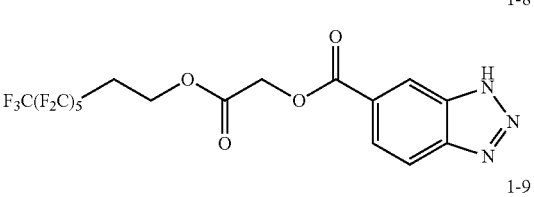

1-10
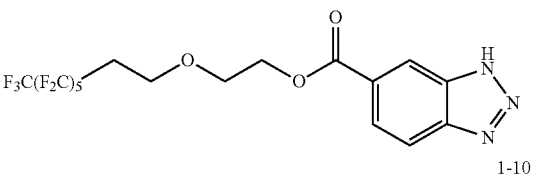

1-11
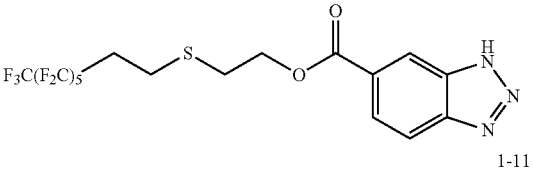

1-12
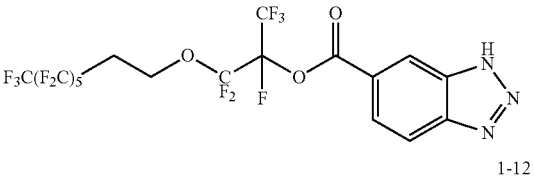

1-13
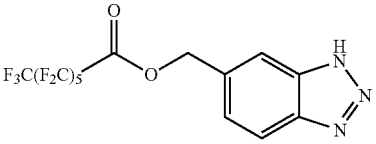

1-14
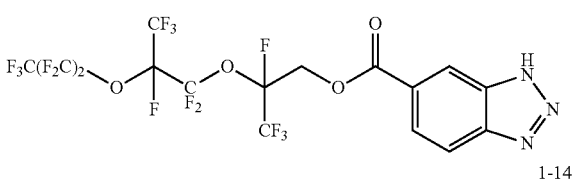

1-15
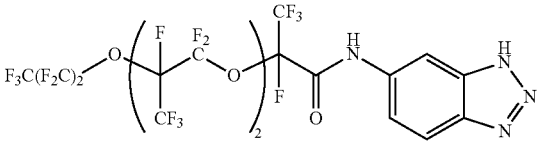

1-16
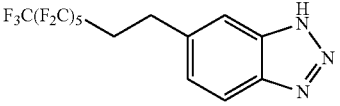

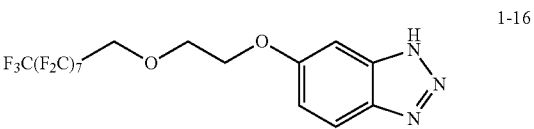

1-17

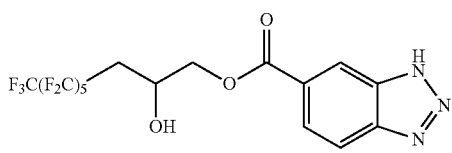

(Compound Represented by General Formula (23))

Next, a compound represented by General Formula (23) will be described. Here, it is preferable for the compound represented by General Formula (23) to contain fluorine atoms in an amount satisfying the above-mentioned fluorine content.

Formula (23)

$$\left(\begin{array}{c}\ce{S}\\ \ce{N-N}\end{array}\ce{S-(CR_{231}R_{232})_{\mathit{n}}-Y_2-(CR_{233}R_{234})_{\mathit{m}}-Rf_2-\underset{(F)_{\mathit{p}}}{\overset{H}{C}}-(H)_{\mathit{l}}}\right)_2$$

In the General Formula (23), each of $R_{231}$ and $R_{232}$ independently represents a hydrogen atom or an alkyl group. When each of $R_{231}$ and $R_{232}$ represents an alkyl group, the alkyl group has preferably 1 to 30 carbon atoms, more preferably 1 to 15 carbon atoms, and particularly preferably 1 to 6 carbon atoms. Preferable examples thereof include methyl, ethyl, n-propyl, isopropyl, t-butyl, n-octyl, eicosyl, chloromethyl, hydroxymethyl, aminoethyl, N,N-dimethylaminomethyl, 2-chloroethyl, 2-cyanoethyl, 2-hydroxyethyl, 2-(N,N-dimethylamino)ethyl, 2-ethylhexyl, and the like.

The structure represented by $(CR_{231}R_{232})_n$ is preferably —CH$_2$—, —CH$_2$CH$_2$— or —CH$_2$CH(CH$_3$)—, more preferably —CH$_2$CH$_2$— or —CH$_2$CH(CH$_3$)—, and particularly preferably —CH$_2$CH$_2$—.

Each of $R_{233}$ and $R_{234}$ independently represents a hydrogen atom or a substituent. Examples of the substituent may include the substituents of the above-mentioned alkyl group represented by $R_2$ and $R_3$.

The structure represented by $(CR_{233}R_{234})_m$ is preferably —CH$_2$—, —CH$_2$CH$_2$—, —CH$_2$CH(CH$_3$)—, CH$_2$CH$_2$CH$_2$—, —CH$_2$CH(OH) CH$_2$— or —CH$_2$CH (CH$_2$OH)—, more preferably —CH$_2$—, —CH$_2$CH$_2$—, —CH$_2$CH(OH)CH$_2$— or —CH$_2$CH$_2$CH$_2$—, and particularly preferably —CH$_2$— or —CH$_2$CH$_2$—.

$Y_2$ represents a single bond, —CO—, or —COO—.

When $Y_2$ is a single bond or —CO—, n represents 0, and m represents an integer 0 to 6. In this case, m is preferably 0 to 4, and more preferably 1 or 2.

When $Y_2$ is —COO—, n represents 1 or 2, and preferably 2. represents an integer 1 to 6, preferably 1 to 4, and more preferably 1 or 2.

$Rf_2$ represents a linear or branched perfluoroalkylene group having 1 to 20 carbon atoms, or a linear or branched perfluoroether group having 1 to 20 carbon atoms.

The number of carbon atoms in the perfluoroalkylene group is 1 to 20, preferably 2 to 15, and more preferably 3 to 12. Specific examples of the perfluoroalkylene group include —C$_4$F$_8$—, —C$_5$F$_{10}$—, —C$_6$F$_{12}$—, —C$_7$F$_{14}$—, —C$_8$F$_{16}$—, —C$_9$F$_{18}$—, —C$_{10}$F$_{20}$—, —C$_{12}$F$_{24}$—, and the like.

The perfluoroether group means a group in which an ethereal oxygen atom (—O—) is inserted between the carbon atoms at one or more places in the perfluoroalkylene group or is inserted in the bonding end of the perfluoroalkylene group. The number of carbon atoms in the perfluoroalkylene group is 1 to 20, preferably 2 to 15, and more preferably 3 to 12. As a specific example of the perfluoroether group, there is mentioned a perfluoroehter group represented by —(C$_g$F$_{2g}$O)$_h$— (with g being an integer 1 to 20, h being an integer 1 or more, and g×h≤20).

p represents an integer 2 or 3 and 1 represents an integer 0 or 1, where p+1=3. It is preferable that p is 3 and 1 is 0.

Specific examples of the compound represented by the General Formula (23) are shown below. However, the present invention is not limited thereto.

1-1

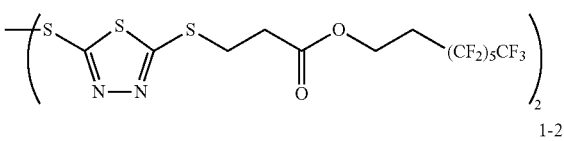

1-2

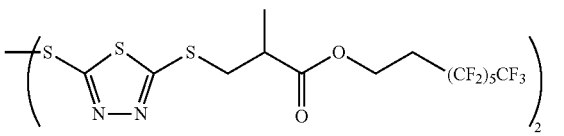

1-3

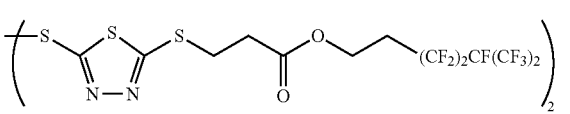

1-4

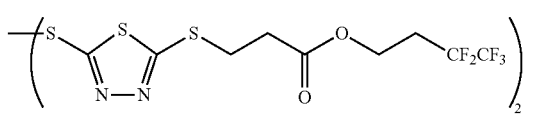

1-5

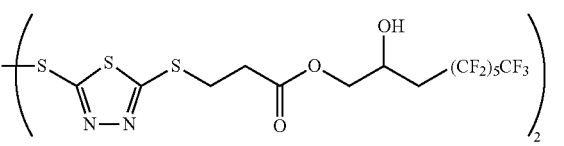

1-6

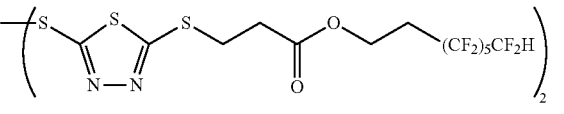

(Compound having group represented by General Formula (24) and group represented by General Formula (25))

Next, a compound having a group represented by General Formula (24) and a group represented by General Formula (25) (hereafter also referred to as "compound X") will be described. Here, it is preferable for the compound X to contain fluorine atoms in an amount satisfying the above-mentioned fluorine content.

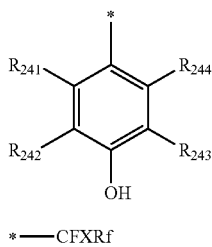

Formula (24)

*——CFXRf     Formula (25)

In the General Formula (24), each of $R_{241}$, $R_{242}$, $R_{243}$, and $R_{244}$ independently represents a hydrogen atom or a substituent. Examples of the substituent include the substituents of the above-mentioned alkyl group represented by $R_2$ and $R_3$. It is preferable for the substituent to be an alkyl group, and it is particularly preferable for each of $R_{242}$ and $R_{243}$ to be an alkyl group (particularly, tert-butyl group). Further, it is preferable for each of $R_{241}$ and $R_{244}$ to be a hydrogen atom.

* represents a bonding position.

In the General Formula (25), X represents a hydrogen atom, a fluorine atom, or a trifluoromethyl group. Among them, a fluorine atom or a trifluoromethyl group is preferable.

Rf represents a fluoroalkyl group having 20 or less carbon atoms, which may have an ethereal oxygen atom and in which at least one hydrogen atom is substituted with a fluorine atom, or represents a fluorine atom. The definition of Rf is the same as that of the above $Rf_1$ except for the number of carbon atoms, and the preferred examples of Rf are also the same as those of $Rf_1$.

* represents a bonding position.

As a preferred example of the compound X, there is mentioned a polymer A having a repeating unit represented by the following General Formula (26) and a repeating unit represented by the following General Formula (27).

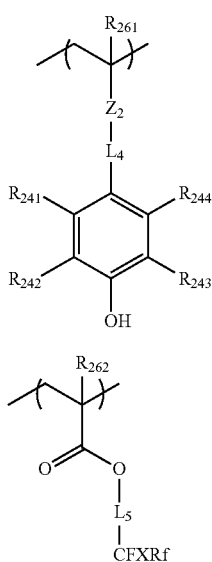

Formula (26)

Formula (27)

In the General Formula (26) and the General Formula (27), each of $R_{261}$ and $R_{262}$ independently represents a hydrogen atom or a substituted or unsubstituted alkyl group having 1 to 4 carbon atoms.

$Z_2$ represents a single bond, an ester group, an amido group, or an ether group.

$L_4$ represents a single bond or a divalent organic group. In a preferred embodiment, the orgnic group represented by $L_4$ is a linear, branched, or cyclic alkylene group, an aromatic group, or a group composed of the combination thereof. In the group composed of the combination of an alkylene group and an aromatic group, the alkylene group and the aromatic group may be combined through an ether group, an ester group, an amido group, a urethane group, or a urea group. It is preferable that the total number of carbon atoms in $L_4$ is 1 to 15. Here, the total number of carbon atoms means, for example, the total number of carbon atoms contained in a substituted or unsubstituted divalent organic group represented by $L_4$. Specific examples of the divalent organic group include a methylene group, an ethylene group, a propylene group, a butylene group, a phenylene group, substitutes of these with a methoxy group, a hydroxyl group, a chlorine atom, a bromine atom, a fluorine atom, or the like, and a group composed of any combination of these.

$L_5$ represents a single bond or a divalent organic group having 1 to 6 carbon atoms and containing no fluorine. Among them, an alkylene group having 2 to 4 carbon atoms is preferable.

The definitions of $R_{241}$ to $R_{244}$, X and Rf in the General Formula (26) and the General Formula (27) are as described above.

The content of the repeating units represented by the General Formula (26) in the polymer A is not particularly limited, but, in terms of the effects of the present invention being more excellent, the content is preferably 5 to 90 mol %, and more preferably 10 to 70 mol %, based on the whole repeating units in the polymer.

The content of the repeating units represented by the General Formula (27) in the polymer A is not particularly limited, but, in terms of the effects of the present invention being more excellent, the content is preferably 10 to 95 mol %, and more preferably 30 to 90 mol %, based on the whole repeating units in the polymer.

The weight average molecular weight of the polymer A is not particularly limited, but, in terms of the ion migration inhibiting ability being more excellent, the weight average molecular weight is preferably 3,000 to 500,000, and more preferably 5,000 to 100,000.

As another preferred example of the compound X, it is preferable that a group represented by the following General Formula (28) is further contained in the compound. * represents a bonding position.

*—$(R_{281}O)_q R_{282}$     General Formula (28)

$R_{281}$ represents an alkylene group having 1 to 4 carbon atoms.

$R_{282}$ represents a hydrogen atom or an alkyl group having 1 to 10 carbon atoms which may have a substituent. $R_{282}$ is preferably a hydrogen atom or an alkyl group having 1 to 4 carbon atoms. Examples of the substituent include the substituents of the above-mentioned alkyl group represented by $R_2$ and $R_3$.

q represents an integer 1 to 210.

As a preferred example of the group represented by the General Formula (28), there is mentioned a group represented by the following General Formula (28-1).

*—$(R_{283}O)_k(R_{284}O)_j R_{282}$     General Formula (28-1)

$R_{283}$ represents an ethylene group. $R_{284}$ represents an alkylene group having 3 or 4 carbon atoms.

k represents an integer 0 to 100, preferably 1 to 50, and more preferably 2 to 23.

j represents an integer 0 to 100, preferably 0 to 50, and more preferably 0 to 23.

In addition, k+j satisfies 2≤k+j≤100.

As a preferred example of the compound X, there is mentioned a polymer B having a repeating unit represented by the General Formula (26), a repeating unit represented by the General Formula (27), and a repeating unit represented by the following General Formula (29).

The General Formulae (26) and (27) are as described above.

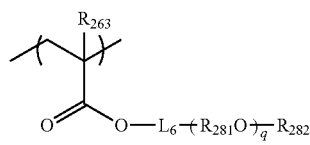

Formula (29)

In the General Formula (29), $R_{263}$ represents a hydrogen atom or a substituted or unsubstituted alkyl group having 1 to 4 carbon atoms.

$L_6$ represents a single bond or a divalent organic group having 1 to 10 carbon atoms and containing no fluorine atoms. When $L_6$ is the above organic group, the organic group is preferably a linear, branched, cyclic or partially cyclic oxyalkylene group having 1 to 10 carbon atoms. Specific examples of the oxyalkylene group include $CH_2CH_{10}CH_2O$ (here, $C_6H_{10}$ is a cyclohexylene group.), $CH_2O$, $CH_2CH_2O$, $CH_2CH(CH_3)O$, $CH(OH_3)O$, $CH_2CH_2CH_2O$, $C(CH_3)_2O$, $CH(CH_2CH_3)CH_2O$, $CH_2CH_2CH_2CH_2O$, $CH(CH_2CH_2CH_3)O$, $CH_2(CH_2)_3CH_2O$, $CH(CH_2CH(CH_3)_2)O$, and the like. Among them, an oxyalkylene group having 2 to 4 carbon atoms is preferable.

The definitions of $R_{281}$, $R_{282}$, and q in the General Formula (29) are as described above.

The content of the repeating units represented by the General Formula (26) in the polymer B is not particularly limited, but, in terms of the effects of the present invention being more excellent, the content is preferably 5 to 80 mol %, and more preferably 10 to 60 mol %, based on the whole repeating units in the polymer.

The content of the repeating units represented by the General Formula (27) in the polymer B is not particularly limited, but, in terms of the effects of the present invention being more excellent, the content is preferably 10 to 85 mol %, and more preferably 20 to 70 mol %, based on the whole repeating units in the polymer.

The content of the repeating units represented by the General Formula (29) in the polymer B is not particularly limited, but, in terms of the effects of the present invention being more excellent, the content is preferably 10 to 85 mol %, and more preferably 20 to 70 mol %, based on the whole repeating units in the polymer.

The weight average molecular weight of the polymer B is not particularly limited, but, in terms of the ion migration inhibiting ability being more excellent, the weight average molecular weight is preferably 3,000 to 500,000, and more preferably 5,000 to 100,000.

Specific examples of the compound X are shown below. However, the present invention is not limited thereto.

(1-4)

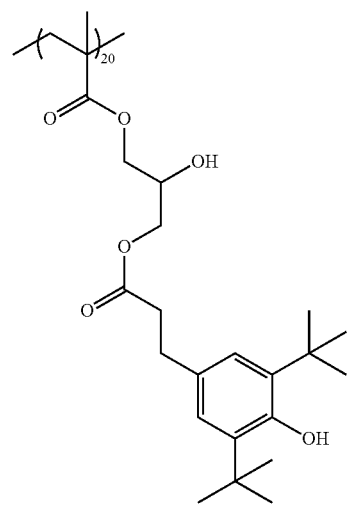

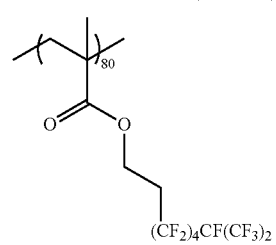

(1-5)

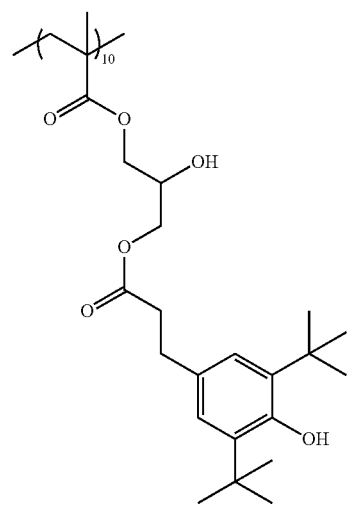

(1-6)

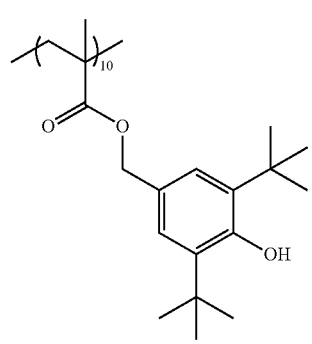

(1-1)

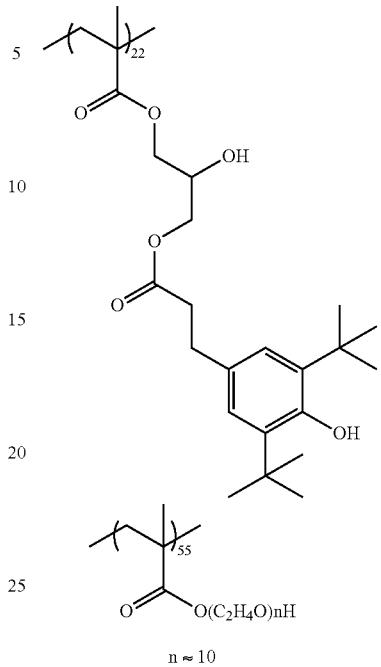

n ≈ 10

(1-3)

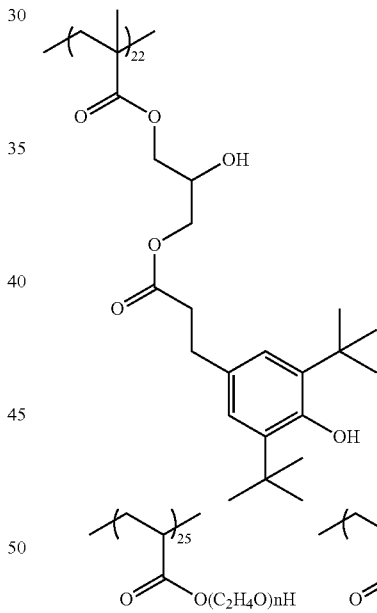

n ≈ 10    k ≈ 13

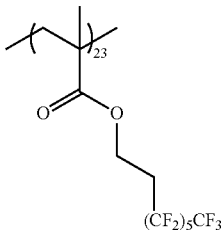

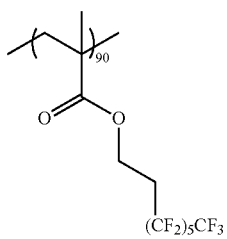

The content of the F-containing migration inhibitor in the composition is not particularly limited, but, in terms of the effects of the present invention being more excellent, the content is preferably 0.05 mass % to 5 mass %, and more preferably 0.1 mass % to 3 mass % with respect to the total mass of metal particles, which will be described below.

<Metal Particles>

Metal particles contained in the composition refer to a metal component constituting a conductive film. More specifically, when the composition of the present invention is applied onto a substrate, and, if necessary, heat treatment is carried out, metal particles are fused with each other so as to form grains, and these grains are adhered to and fused with each other, so as to form a conductive film.

The kind of metal atoms constituting metal particles is not particularly limited, and the kind of metal atoms is appropriately and optimally selected depending on the intended use. In particular, from the point of application to a wiring circuit such as a printed wiring board, preferable examples include gold, silver, copper, aluminum, nickel, and alloys of these.

The average particle size of the metal particles is not particularly limited. Two kinds of metal particles, that is, metal particles having a micro-order average particle size (hereafter also referred to as "metal microparticles") and metal particles having a nano-order average particle size (hereafter also referred to as "metal nanoparticles") are mainly used.

The average particle size of the metal microparticles is not particularly limited, but, in terms of conductive characteristics of the conductive film being more excellent, the average particle size is preferably 0.5 µm to 10 µm, and more preferably 1 µm to 5 µm.

The average particle size of the metal nanoparticles is not particularly limited, but, in terms of conductive characteristics of the conductive film being more excellent, the average particle size is preferably 5 nm to 100 nm, and more preferably 10 nm to 20 nm.

Here, the average particle size of metal particles is a mean value obtained by observing metal particles using an electron microscope (SEM or TEM), measuring the primary particle sizes (diameters) of 20 metal particles or more and then arithmetically averaging the measured primary particle sizes.

If necessary, the surface of metal particles may be coated with a protecting agent. If the surface of metal particles is coated with the protecting agent, the storage stability of the metal particles in the conductive film forming composition is improved.

The kind of the protecting agent used is not particularly limited. As the protecting agent, a known polymer (for example, a polymer having a functional group with free electrons at the side chain thereof, such as polyvinyl pyrrolidone), a known surfactant, or the like may be used.

Especially, regarding metal nanoparticles, it is preferable that the surface thereof is coated with a protecting agent, and it is particularly preferable that a protecting agent having a weight loss of 30% or more when heated to 160° C. in thermogravimetric analysis (TGA) is used. If such a protecting agent is used, at the time of forming a conductive film by performing heat treatment, the protecting agent hardly remains in the conductive film, and thus a conductive film having excellent conductive characteristics can be obtained.

The content of metal particles in the composition is not particularly limited, but, in terms of coating properties and storage stability of the composition, the content is preferably 30 mass % to 85 mass %, and more preferably 40 mass % to 80 mass % with respect to the total mass of the composition.

<Other Components>

The conductive film forming composition, if necessary, may contain other components in addition to the F-containing migration inhibitor and the metal particles.

For example, the composition may contain a resin binder. If the composition contains the resin binder, adherence between the substrate and the conductive film is further improved. The kind of the resin binder used is not particularly limited, and examples thereof include epoxy resin, acrylic resin, polyvinylpyrrolidone, and a reaction product of a silane coupling agent.

Moreover, the composition may contain a solvent. The kind of the solvent used is not particularly limited, and water or an organic solvent may be used.

Examples of the organic solvent used include alcohol-based solvents (for example, methanol, ethanol, isopropanol, sec-butanol, carbitol, 2-heptanol, octanol, 2-ethylhexanol, α-terpineol, and diethylene glycol monoethyl ether), ketone-based sovents (for example, acetone, methyl ethyl ketone, methyl isobutyl ketone, cyclopentanone, and cyclohexanone), hydrocarbon-based solvents (for example, heptane, octane, and dodecane), aromatic hydrocarbon-based solvents (for example, toluene and xylene), amide-based solvents (for example, formamide, dimethylacetamide, N-methylpyrrolidone, and dimethyl propylene urea), nitrile-based solvents (for example, acetonitrile and propionitrile), ester-based solvents (for example, methyl acetate and ethyl acetate), carbonate-based solvent (for example, dimethyl carbonate and diethyl carbonate), ether-based solvents, halogen-based solvents, and the like. These solvents may be used in a mixture of two or more of these.

When a solvent is contained in the composition, in terms of coating properties and storage stability of the composition being excellent, the content of the solvent in the composition is preferably 10 mass % to 70 mass %, and more preferably 15 mass % to 55 mass % with respect to the total mass of the composition.

<Method of Manufacturing Conductive Film>

It is possible to manufacture a conductive film using the above composition.

The method of manufacturing a conductive film is not particularly limited but exemplified by a method of manufacturing a conductive film by applying the above composition onto a substrate and, if necessary, performing curing treatment.

The kind of the substrate coated with the composition is not particularly limited, and an optimal substrate is selected depending on the intended use. Examples of the substrate include a resin substrate, a glass substrate, and a ceramic substrate. From the viewpoint of application to a wiring board, it is preferable to use a substrate having insulating properties (insulating substrate).

The method of applying the composition is not particularly limited, and examples thereof include known methods, such as an inkjet method, screen printing method, a gravure printing method, a gravure offset printing method, an offset printing method, and a flexo printing method.

After the application of the composition, if necessary, in order to remove a solvent, drying treatment may be carried out. Heating conditions during the drying treatment are not particularly limited, but, in terms of productivity, it is preferable that the heating is carried out at 50° C. to 150° C. (preferably 80° C. to 120° C.) for 5 minutes to 2 hours (preferably 10 minutes to 1 hour).

The method of curing the coating film obtained by applying the composition is not particularly limited. For example, heat treatment or light irradiation treatment is carried out.

As the conditions of heat treatment, appropriate and optimal conditions are selected according to the kind of the metal particles used. In terms of a conductive film with more excellent conductivity being able to be formed in a short period of time, heating temperature is preferably 150° C. to 400° C., and more preferably 150° C. to 250° C., and heating time is preferably 5 minutes to 120 minutes, and more preferably 10 minutes to 60 minutes.

Here, a heating device is not particularly limited, and a known heating device, such as an oven, a hot plate, and the like, can be used.

In the light irradiation treatment, unlike the above-described heat treatment, sintering can be performed by irradiating a portion provided with a coating film with light at room temperature for a short time, and thus the deterioration of the substrate due to long-term heating does not occur, and the adhesiveness between the conductive film and the substrate becomes better.

The light source used in the light irradiation treatment is not particularly limited, and examples thereof include a mercury lamp, a metal halide lamp, a xenon lamp, a chemical lamp, and a carbon arc lamp. Examples of radiation include electron beam, X-ray, ion beam, and far-infrared ray. Further, as the radiation, g-spectral line, i-spectral line, deep-UV light, and high-density energy beam (laser beam) may also be used.

Specific measures for the light irradiation treatment preferably include scanning exposure by an infrared laser, high-illuminance flash exposure by a xenon discharge lamp, and exposure by an infrared lamp.

The light irradiation is preferably light irradiation by a flash lamp, and more preferably pulsed light irradiation by a flash lamp. In the irradiation of high-energy pulsed light, the surface of the portion provided with the coating film can be intensively heated for a very short time, and thus the influence of heat on the substrate can be made extremely small.

The irradiation energy of pulsed light is preferably 1 $J/cm^2$ to 100 $J/cm^2$, and more preferably 1 $J/cm^2$ to 30 $J/cm^2$, and the pulse width of pulsed light is preferably 1 μs to 100 ms, and more preferably 10 μs to 10 ms. The irradiation time of pulsed light is preferably 1 ms to 100 ms, more preferably 1 ms to 50 ms, and further preferably 1 ms to 20 ms.

The heat treatment and the light irradiation treatment may be carried out alone, and both of them may be carried out at the same time. Further, the other treatment may be carried out after one treatment is carried out.

<Conductive Film>

In the conductive film formed by the above procedures, the F-containing migration inhibitor is unevenly distributed in the surface layer portion of the conductive film. Hereinafter, it will be described in more detail with reference to FIG. 1.

FIG. 1 shows a schematic cross-sectional view of a first embodiment of the inventive wiring board. In FIG. 1, a wiring board 10 includes a substrate 12, and a conductive film 14 disposed over the entire surface of the substrate 12. Here, as will be described later, the shape of the conductive film 14 is not limited to that shown in FIG. 1, and the conductive film 14 may be disposed in a patterned shape (for example, striped shape or lattice shape).

The conductive film 14 is a layer disposed on the substrate 12, and functions as a conductor portion.

The conductive film 14 is constituted with a metal derived from the above-described metal particle, and contains the F-containing migration inhibitor.

As shown in FIG. 1, the conductive film 14 has an inner region 14a, and a surface layer region 14b disposed on the inner region 14a. The surface layer region 14b covers the surface of the inner region 14a that is not in contact with the substrate 12. Here, the surface layer region 14b corresponds to a region extending from the exposed surface of the conductive film 14 to a depth position corresponding to 1/10 of the total thickness of the conductive film 14. The inner region 14a corresponds to the conductive film 14 exclusive of the surface layer region 14b. That is, the thickness of the surface layer region 14b corresponds to 1/10 of the thickness T2 of the conductive film 14. Here, the total thickness of the conductive film 14 is obtained by measuring the total thickness of the conductive film 14 at five or more arbitrary points and arithmetically averaging the measurements.

The above F-containing migration inhibitor is unevenly distributed in the surface layer region 14b of FIG. 1. More specifically, the F-containing migration inhibitor is contained in the conductive film 14, and the mass Y of the F-containing migration inhibitor contained in the surface layer region 14b is larger than the mass X of the F-containing migration inhibitor contained in the inner region 14a. That is, a relationship of mass Y>mass X (a relationship of mass X/mass Y of less than 1) is satisfied. When the above relationship is satisfied, the ion migration from the conductive film 14 is suppressed, and simultaneously the conductive characteristics of the conductive film 14 are excellent. Especially, in terms of balance between ion migration inhibiting function and conductive characteristics being more excellent, the ratio (X/Y) of the mass X of the F-containing migration inhibitor contained in the inner region 14a to the mass Y of the F-containing migration inhibitor contained in the surface layer region 14b is preferably 0.20 or less, and more preferably 0.10 or less. The lower limit thereof is not particularly limited, but is most preferably 0. Practically, the lower limit thereof may be 0.001 or more.

The measurement method of the ratio (X/Y) is not particularly limited. For example, the ratio (X/Y) can be obtained by observing the vertical section of the conductive film 14, which extends in a direction perpendicular to the surface of the substrate 12, with an electron microscope (SEM or TEM), performing the elemental analysis of components contained in a region corresponding to the inner region 14a and components contained in a region corresponding to the surface layer region 14b, and comparing the amounts of elements derived from the F-containing migration inhibitor.

The content of the F-containing migration inhibitor contained in the entire conductive film 14 is not particularly limited, but, from the viewpoint of conductive characteristics of the conductive film 14, the content is preferably 0.01 mass % to 10 mass %, and more preferably 0.1 mass % to 5 mass %, with respect to the total mass of the conductive film 14.

The content of the F-containing migration inhibitor contained in the surface layer region 14b is not particularly limited, but, from the viewpoint of conductive characteristics of the conductive film 14, the content is preferably 50 mass % to 100 mass %, and more preferably 70 mass % to 100 mass %, with respect to the total mass of the migration inhibitor.

The conductive film 14 may contain a component other than the metal and the migration inhibitor within a range not impairing the effects of the present invention. For example, the conductive film 14 may contain a binder resin (epoxy resin, acrylic resin, polyvinyl pyrrolidone, or the like).

Next, a second embodiment of the wiring board of the present invention will be described in detail with reference to the accompanying drawing.

Figure 2:
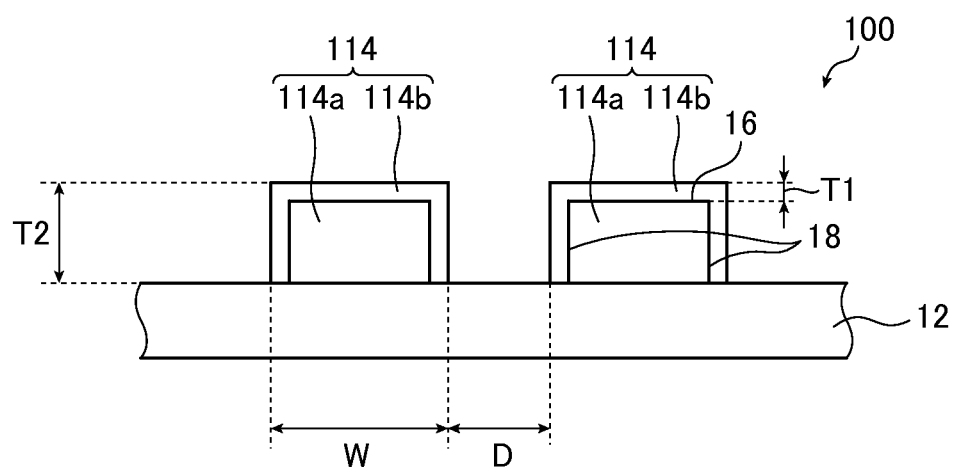
FIG. 2 is a schematic cross-sectional view showing a second embodiment of the wiring board of the present invention.

FIG. 2 is a schematic cross-sectional view showing the second embodiment of the wiring board of the present invention. A wiring board 100 includes the substrate 12 and two thin wire-shaped conductive films 114 disposed on the substrate 12. The method for manufacturing the conductive film having such a patterned shape as shown in FIG. 2 is not particularly limited but exemplified by a method in which the conductive film forming composition is ejected at predetermined positions on the substrate by the aforementioned inkjet method.

The conductive film 114 has an inner region 114a, and a surface layer region 114b covering the surface of the inner region 114a that is not in contact with the substrate 12.

The conductive film 114 corresponds to the conductive film 14 in the wiring board 10 shown in FIG. 1, and has the same configuration as the conductive film 14 except for the shape thereof. In other words, the inner region 114a corresponds to the inner region 14a in the wiring board 10 shown in FIG. 1, and the surface layer region 114b corresponds to the surface layer region 14b in the wiring board 10 shown in FIG. 1.

To be more specific: The preferred examples of the metal constituting the conductive film 114 are the same as those in the above-described first embodiment.

In addition, as in the above-described first embodiment, the thickness T1 of the surface layer region 114b corresponds to 1/10 of the total thickness T2 of the conductive film 114.

Further, as in the above-described first embodiment, the mass Y of the F-containing migration inhibitor contained in the surface layer region 114b is greater than the mass X of the F-containing migration inhibitor contained in the inner region 114a, and the preferred examples of the mass ratio are also the same as those in the above-described first embodiment.

Moreover, the preferred range of the mass of the F-containing migration inhibitor contained in the entire conductive film 114 and the preferred range of the mass of the F-containing migration inhibitor contained in the surface layer region 114b are the same as those in the above-described first embodiment.

In FIG. 2, the inner region 114a has a thin wire shape, and the surface layer region 114b is so disposed as to cover the inner region 114a (as to cover a top face portion 16 and two lateral face portions 18 of the inner region 114a).

While the conductive film 114 in FIG. 2 is a layer of which the vertical section is rectangular, the conductive film 114 is not particularly limited in shape of its vertical section, that is to say, its vertical section may be of any shape.

In FIG. 2, the two conductive films 114 are arranged in the form of stripes, but the number and arrangement pattern thereof are not particularly limited.

The width W of the conductive film 114 is preferably 0.1 μm to 10,000 μm, more preferably 0.1 μm to 300 μm, still more preferably 0.1 μm to 100 μm, and particularly preferably 0.2 μm to 50 μm, in terms of high integration of wiring board.

The interval D between the conductive films 114 is preferably 0.1 μm to 1,000 μm, more preferably 0.1 μm to 300 μm, still more preferably 0.1 μm to 100 μm, and particularly preferably 0.2 μm to 50 μm, in terms of high integration of wiring board.

The thickness T2 of the conductive film 114 is preferably 0.001 μm to 100 μm, more preferably 0.01 μm to 30 μm, and still more preferably 0.01 μm to 20 μm, in terms of high integration of wiring board.

The wiring board including the aforementioned conductive film can be used for various applications and structures, for example, such as a printed circuit board, a panel substrate for plasma display panels, a substrate for solar cell electrodes, a membrane circuit board, and a substrate for touch panel electrodes.

Further, it is preferable for the wiring board to be included in electronic equipment. Here, the electronic equipment refers to a touch panel; a membrane switch; equipment in which a touch panel or a membrane switch is installed such as a TV, mobile communication equipment, a personal computer, game equipment, in-vehicle display equipment, net communication equipment, or the like; an LED for lighting and display; an electronic wiring device for solar cell control; a wireless communication device such as RFID or the like; equipment controlled to drive by a semiconductor wiring board or an organic TFT circuit board; or the like.

If necessary, an insulating layer may be further provided on the conductive film side of the wiring board of the present invention.

Figure 3:
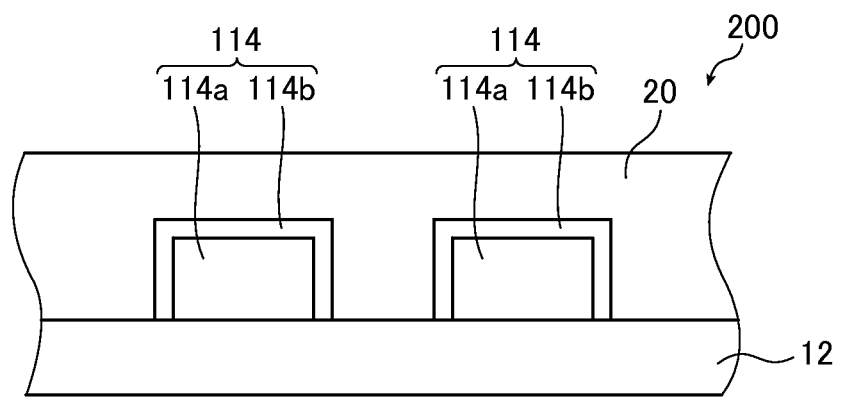
FIG. 3 is a schematic cross-sectional view showing an embodiment of a wiring board with an insulating layer of the present invention.

For example, as shown in FIG. 3, if necessary, an insulating layer 20 may be further provided on the conductive film 114 side of the wiring board 100 so as to cover the conductive films 114, thereby forming an insulating layer-provided wiring board 200. If the insulating layer 20 is provided, insulation characteristics between the conductive films 114 are further improved.

Known insulating materials can be used for the material of the insulating layer 20. Examples thereof include an epoxy resin, an aramid resin, a crystalline polyolefin resin, an amorphous polyolefin resin, a fluorine-containing resin (polytetrafluoroethylene, perfluorinated polyimide, perfluorinated amorphous resin, and the like), a polyimide resin, a polyether sulfone resin, a polyphenylene sulfide resin, a polyether ether ketone resin, an acrylate resin, and the like.

In addition, as the insulating layer 20, so-called optically clear adhesive sheet (OCA) may be used. Commercially available OCA products may be used, and examples thereof include 8171 CL series and 8146 CL series (manufactured by 3M Ltd.), and the like.

Further, as the insulating layer 20, so-called solder resist layer may be used. Commercially available solder resist products may be used, and examples thereof include PFR800 and PSR4000 (trade names; manufactured by Taiyo Ink Mfg. Co., Ltd.), SR7200G (manufactured by Hitachi Chemical Co., Ltd.), and the like.

EXAMPLES

Hereinafter, the present invention will be described in more detail by Examples, to which the present invention is not limited.

Comparative Example 1

Conductive Film Forming Composition A-1 Not Containing F-containing Migration Inhibitor 2.04 g (20.0 mmol) of N,N-dimethyl-1,3-diaminopropane (Tokyo Chemical Industry Co., Ltd.; special grade), 1.94 g (15.0 mmol) of n-octylamine (Kao Corporation; purity, 98%), and 0.93 g (5.0 mmol) of n-dodecylamine (Kanto Chemical Co., Inc.; special grade) were mixed to obtain a mixed solution. Then, to the mixed solution, 6.08 g (20.0 mmol) of silver oxalate [synthesized from silver nitrate (Kanto Chemical Co., Inc.; first grade) and ammonium oxalate monohydrate or oxalic acid dihydrate (Kanto Chemical Co., Inc.; special grade)] was added and the resultant mixture was stirred for 3 minutes to prepare an oxalic acid ion-alkylamine-alkyldiamine-silver complex compound. When the complex compound was heated and stirred at 95° C. for 20 to 30 minutes, it was changed to a suspension exhibiting a blue luster due to the completion of a reaction accompanied with foaming of carbon dioxide. 10 mL of methanol (Kanto Chemical Co., Inc.; first grade) was added to the suspension, then the suspension was centrifuged to obtain a precipitate, and the precipitate was air dried to obtain 4.62 g (silver-based yield, 97.0%) of a solid of coated silver ultrafine particles exhibiting a blue luster. The solid was dispersed in 6.93 g of mixed solvent (4/1: v/v) of n-butanol (Kanto Chemical Co., Inc.; special grade) and n-octane (Kanto Chemical Co., Inc.; special grade) to obtain the conductive film forming composition A-1 not containing an F-containing migration inhibitor.

Comparative Example 2

Conductive Film Forming Composition A-2 Not Containing F-containing Migration Inhibitor As the conductive film forming composition A-2 not containing an F-containing migration inhibitor, polymer type conductive paste LS-450-7H (manufactured by Asahi Chemical Research Laboratory Co., Ltd.) was used.

Comparative Example 3

Conductive Film Forming Composition A-3 Not Containing F-containing Migration Inhibitor As the conductive film forming composition A-3 not containing an F-containing migration inhibitor, flow metal SW-1020 (manufactured by Bando Chemical Industries, Ltd.) was used.

Comparative Example 4

Conductive Film Forming Composition B-9 Not Containing F-containing Migration Inhibitor The conductive film forming composition B-9 was obtained by adding IRGANOX 1135 (manufactured by BASF Corporation) (0.12 g) to the conductive film forming composition A-1 (11.55 g) obtained in Comparative Example 1 and stirring the mixture.

Here, the conductive film forming composition B-9 did not contain an F-containing migration inhibitor.

Comparative Example 5

Conductive Film Forming Composition B-10 Not Containing F-containing Migration Inhibitor The conductive film forming composition B-10 was obtained by adding benzotriazole (0.12 g) to the conductive film forming composition A-2 (10 g) of Comparative Example 2 and stirring the mixture.

Here, the conductive film forming composition B-10 did not contain an F-containing migration inhibitor.

Synthesis Example 1

Compound M-1

3-(3,5-di-tert-butyl-4-hydroxyphenyl)propionc acid (3.5 g, 12.6 mmol), dichloromethane (20 ml), 2,2,3,3,4,4,5,5,6,6,7,7,8,8,9,9,10,10,10-nonadecafluorodecan-1-ol (6.3 g, 12.6 mmol), tetrahydrofuran (10 ml), 1-ethyl-3-(3-dimethylaminopropyl)carbodiimide hydrochloride (2.4 g, 12.6 mmol), and 4-dimethylaminopyridine (0.05 g, 0.4 mmol) were put into a reaction vessel in this order to obtain a reaction solution.

The reaction solution was stirred at room temperature for 3 hours, 1N hydrochloric acid (50 ml) was added thereto, and then the resultant solution was extracted with 100 ml of ethyl acetate to obtain an organic layer. The organic layer was washed with saturated saline and dried over magnesium sulfate. After solid content was filtered off, the organic layer was concentrated under reduced pressure to obtain white crude crystals. The white crude crystals were recrystallized with methanol to obtain 6.0 g of the compound M-1 (yield, 63%).

$^1$H-NMR spectrum of the obtained compound M-1 was as follows.

$^1$H-NMR (solvent: deuterated chloroform, reference: tetramethylsilane) 6.98 (2H, s), 5.09 (1H, s), 4.59 (2H, t), 2.90 (2H, t), 2.71 (2H, t), 1.43 (9H, s)

In the $^1$H-NMR data, the peak of each proton was observed at the characteristic position, and thus the resulting product was identified as the compound M-1.

Here, the fluorine content of the compound M-1 was 47.5 mass %.

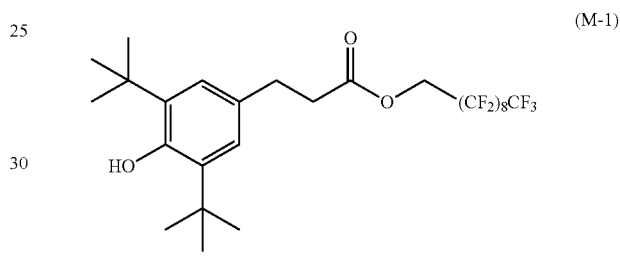

(M-1)

Synthesis Example 2

Compound M-2

1,3,4-thiadiazole-2,5-dithiol (manufactured by Wako Pure Chemical Industries, Ltd.) (4.0 g, 26.6 mmol) and tetrahydrofuran (80 ml) were put into a reaction vessel, and completely dissolved to obtain a reaction solution. Then, 3,3,4,4,5,5,6,6,7,8,8,8-dodecafluoro-7-(trifluoromethyl)octyl acrylate (12.5 g, 26.6 mmol) was dropped into the reaction solution over 0.5 hours by a dropping funnel. The reaction solution was stirred at 65° C. for 6 hours, cooled to room temperature, and then concentrated under reduced pressure. To the reaction solution, 200 mL of hexane was added, and the resultant solution was cooled in an ice bath to obtain 16 g of crude crystals. 8 g of the crude crystals were purified by silica gel column chromatography (mobile phase: hexane/ethyl acetate=2/1 to 1/1) to obtain 6 g of the compound M-2 of the present invention (yield, 72%).

$^1$H-NMR spectrum of the obtained compound M-2 was as follows.

$^1$H-NMR (solvent: deuterated chloroform, reference: tetramethylsilane) 11.1 (1H, br), 4.44 (2H, t), 3.40 (2H, t), 2.85 (2H, t), 2.49 (2H, t), 2.49 (2H, m)

In the $^1$H-NMR data, the peak of each proton was observed at the characteristic position, and thus the resulting product was identified as the compound M-2.

Here, the fluorine content of the compound M-2 was 47.2 mass %.

(M-2)

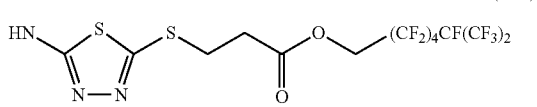

Synthesis Example 3

Compound M-3

1H-benzotriazole-5-carboxylic acid (1.5 g, 9.19 mmol), tetrahydrofuran (27 ml), dimethylformamide (3 ml), 3,3,4,4,5,5,6,6,7,7,8,8,8-tridecafluoro-1-octanol (3.35 g, 9.19 mmol), 1-ethyl-3-(3-dimethylaminopropyl)carbodiimide hydrochloride (1.76 g, 9.19 mmol), and 4-dimethylaminopyridine (0.11 g, 0.91 mmol) were put into a reaction vessel in this order to obtain a reaction solution. After the reaction solution was stirred at 70° C. for 24 hours, 50 ml of water was added thereto, and then the reaction solution was extracted with 100 ml of ethyl acetate to obtain an organic layer. The organic layer was washed with saturated saline and dried over magnesium sulfate. After solid content was filtered off, the organic layer was concentrated under reduced pressure. The resultant solution was purified by silica gel column chromatography (mobile phase: hexane/ethyl acetate=2/1) to obtain 3.1 g of the compound M-3 (yield, 66%).

Here, the fluorine content of the compound M-3 was 48.5 mass %.

(M-3)

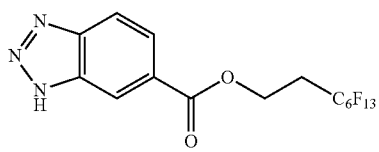

Synthesis Example 4

Compound M-4

Compound M-4A was synthesized according to the following scheme.

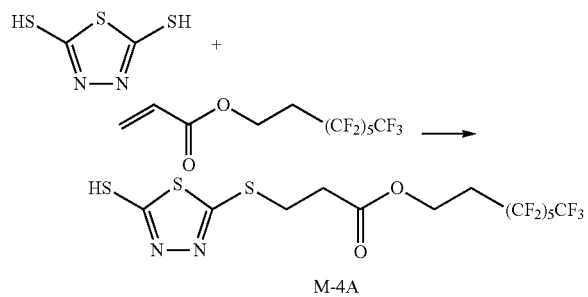

M-4A 1,3,4-thiadiazole-2,5-dithiol (manufactured by Wako Pure Chemical Industries, Ltd.) (4.0 g, 26.6 mmol) and tetrahydrofuran (80 ml) were put into a reaction vessel, and completely dissolved to obtain a reaction solution. Then, 3,3,4,4,5,5,6,6,7,7,8,8,8-tridecafluorooctyl acrylate (11.13 g, 26.6 mmol) was dropped into the reaction solution over 0.5 hours by a dropping funnel. The reaction solution was stirred at 65° C. for 6 hours, cooled to room temperature, and then concentrated under reduced pressure. To the resulting reaction mixture, 200 mL of hexane was added, and the resultant mixture was cooled in an ice bath to obtain 15 g of crude crystals. 7.5 g of the crude crystals were purified by silica gel column chromatography (mobile phase: hexane/ethyl acetate=2/1 to 1/1) to obtain 6 g of the compound M-4A (yield, 79%).

Next, the compound M-4A thus obtained was used to synthesize compound M-4 according to the following scheme.

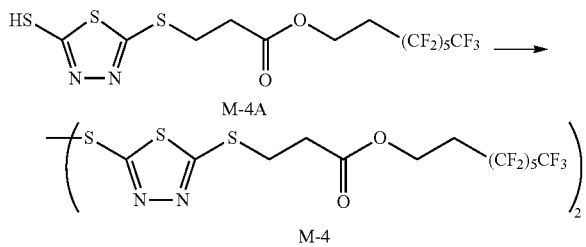

The compound M-4A (3.0 g, 5.28 mmol) and ethyl acetate (20 ml) were put into a reaction vessel, and completely dissolved to obtain a reaction solution. To the reaction solution, sodium iodide (79.1 mg, 0.528 mmol) and 30% hydrogen peroxide (22.11 mmol, 2.39 g) were added in this order, and the reaction solution was stirred at room temperature for 1 hour to precipitate crystals. The precipitated crystals were washed with 100 ml of water to obtain crude crystals, and 2.7 g of the crude crystals were purified by silica gel column chromatography (mobile phase: hexane/ethyl acetate=2/1 to 1/1) to obtain 2.4 g of the compound M-4 (yield, 80%).

$^1$H-NMR spectrum of the obtained compound M-4 of the present invention was as follows.

$^1$H-NMR (solvent: deuterated chloroform, reference: tetramethylsilane): 4.43 (2H, t), 3.60 (2H, t), 2.95 (2H, t), 2.49 (2H, m)

In the $^1$H-NMR data, the peak of each proton was observed at the characteristic position, and thus the resulting product was identified as the compound M-4.

Here, the fluorine content of the compound M-4 was 43.5 mass %.

(M-4)

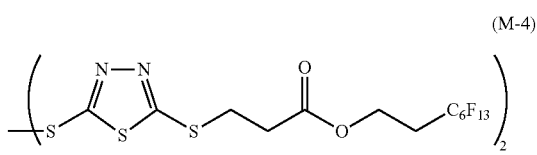

Synthesis Example 5

Compound M-5

27.3 g of 4-methyl-2-pentanone (manufactured by Wako Pure Chemical Industries, Ltd.) was put into a 300 mL three-neck flask, and heated to 80° C. under a nitrogen gas stream. Then, a solution of 37.6 g of 3,3,4,4,5,5,6,6,7,7,8, 8,8-tridecafluorooctyl acrylate, 1.42 g of glycidyl methacrylate (manufactured by Tokyo Chemical Industry Co., Ltd.), 0.92 g of V-601 (manufactured by Wako Pure Chemical Industries, Ltd.), and 63.8 g of 4-methyl-2-pentanone (manufactured by Wako Pure Chemical Industries, Ltd.) was dropped thereinto over 4 hours. After the completion of the dropping, the resultant mixture was stirred for 2 hours, heated to 90° C., and further stirred for 2 hours. To the resulting reaction solution, 3.34 g of 3-(3,5-di-tert-butyl-4-hydroxyphenyl)propionic acid and 0.21 g of dimethyldodecylamine (manufactured by Wako Pure Chemical Industries, Ltd.) were added, and the reaction solution was heated to 120° C. and reacted for 24 hours. After the reaction was terminated, to the resultant solution, 500 ml of hexane and 500 ml of ethyl acetate were added to obtain an organic layer. The organic layer was washed with 300 ml of a 5% aqueous citric acid solution, and then washed with 300 ml of a 5% aqueous ammonia solution. The organic layer was further washed with 300 ml of a 5% aqueous citric acid solution, and then washed with 300 ml of water. The organic layer was concentrated under reduced pressure, and then reprecipitated with hexane and dried under reduced pressure to obtain 30 g of the compound M-5 (Mw=7,000). Here, the weight average molecular weight refers to a value in terms of polystyrene that is measured by a gel permeation chromatography (GPC) method. The measurement of the weight average molecular weight by a GPC method was carried out by dissolving the polymer in tetrahydrofuran, using a high-speed GPC (HLC-8220GPC; manufactured by Tosoh Corporation), using TSKgel SuperHZ4000 (manufactured by Tosoh Corporation; 4.6 mm I.D.×15 cm) as a column, and using THF (tetrahydrofuran) as an eluent.

The compound M-5 corresponds to the compound having the group represented by the General Formula (24) and the group represented by the General Formula (25).

Here, the fluorine content of the compound M-5 was 53.1 mass %.

Synthesis Example 6

Compound M-6

14.3 g of 1-methoxy-2-propanol (manufactured by Wako Pure Chemical Industries, Ltd.) was put into a 300 mL three-neck flask, and heated to 80° C. under a nitrogen gas stream. Then, a solution of 4.81 g of 3,3,4,4,5,5,6,6,7,7,8,8-tridecafluorooctyl acrylate, 1.56 g of glycidyl methacrylate (manufactured by Tokyo Chemical Industry Co., Ltd.), 14.09 g of Blemmer AE-400 (manufactured by NOF Corporation), 0.46 g of V-601 (manufactured by Wako Pure Chemical Industries, Ltd.), and 33.4 g of 1-methoxy-2-propanol (manufactured by Wako Pure Chemical Industries, Ltd.) was dropped thereinto over 4 hours to obtain a reaction solution. After the completion of the dropping, the resultant solution was stirred for 2 hours, heated to 90° C., and further stirred for 2 hours. To the resulting reaction solution, 3.67 g of 3-(3,5-di-tert-butyl-4-hydroxyphenyl)propionic acid and 0.23 g of dimethyldodecylamine (manufactured by Wako Pure Chemical Industries, Ltd.) were added, and the reaction solution was heated to 120° C. and reacted for 24 hours. After the reaction was terminated, the reaction solution was concentrated under reduced pressure and diluted with 200 g of water. The reaction solution was filtred through a filter, and then heated to 60° C. to separate and extract a polymer solution, thereby obtaining 45 g of a 35 wt % aqueous solution of the compound M-6 (Mw=8,000).

Here, the weight average molecular weight refers to a value in terms of polystyrene that is measured by a gel permeation chromatography (GPC) method. The measurement of the weight average molecular weight by a GPC method was carried out by dissolving the polymer in tetrahydrofuran, using a high-speed GPC (HLC-8220GPC; manufactured by Tosoh Corporation), using TSKgel SuperHZ4000 (manufactured by Tosoh Corporation; 4.6 mm I.D.×15 cm) as a column, and using THF (tetrahydrofuran) as an eluent.

The compound M-6 corresponds to the compound having the group represented by the General Formula (24), the group represented by the General Formula (25), and the group represented by the General Formula (28).

Example 1

Conductive Film Forming Composition B-1
Containing F-containing Migration Inhibitor To the conductive film forming composition A-1 (11.55 g) obtained in Comparative Example 1, the compound M-1 (0.12 g) obtained in Synthesis Example 1 was added and the resultant mixture was stirred to obtain the conductive film forming composition B-1 containing F-containing migration inhibitor.

Example 2

Conductive Film Forming Composition B-2
Containing F-containing Migration Inhibitor To the conductive film forming composition A-1 (11.55 g) obtained in Comparative Example 1, the compound M-2 (0.12 g) obtained in Synthesis Example 2 was added and the resultant mixture was stirred to obtain the conductive film forming composition B-2 containing F-containing migration inhibitor.

Example 3

Conductive Film Forming Composition B-3
Containing F-containing Migration Inhibitor To the conductive film forming composition A-1 (11.55 g) obtained in Comparative Example 1, the compound M-3 (0.12 g) obtained in Synthesis Example 3 was added and the resultant mixture was stirred to obtain the conductive film forming composition B-3 containing F-containing migration inhibitor.

Example 4

Conductive Film Forming Composition B-4
Containing F-containing Migration Inhibitor To the conductive film forming composition A-1 (11.55 g) obtained in Comparative Example 1, the compound M-4 (0.12 g) obtained in Synthesis Example 4 was added and the resultant mixture was stirred to obtain the conductive film forming composition B-4 containing F-containing migration inhibitor.

Example 5

Conductive Film Forming Composition B-5
Containing F-containing Migration Inhibitor To the conductive film forming composition A-1 (11.55 g) obtained in Comparative Example 1, the compound M-5

(polymer type) (0.12 g) obtained in Synthesis Example 5 was added and the resultant mixture was stirred to obtain the conductive film forming composition B-5 containing F-containing migration inhibitor.

Example 6

Conductive Film Forming Composition B-6 Containing F-containing Migration Inhibitor To the conductive film forming composition A-2 (10 g) obtained in Comparative Example 2, the compound M-1 (0.12 g) obtained in Synthesis Example 1 was added and the resultant mixture was stirred to obtain the conductive film forming composition B-6 containing F-containing migration inhibitor.

Example 7

Conductive Film Forming Composition B-7 Containing F-containing Migration Inhibitor To the conductive film forming composition A-2 (10 g) obtained in Comparative Example 2, the compound M-3 (0.12 g) obtained in Synthesis Example 3 was added and the resultant mixture was stirred to obtain the conductive film forming composition B-7 containing F-containing migration inhibitor.

Example 8

Conductive Film Forming Composition B-8 Containing F-containing Migration Inhibitor To the conductive film forming composition A-3 (10 g) obtained in Comparative Example 3, the compound M-6 (0.12 g) obtained in Synthesis Example 6 was added and the resultant mixture was stirred to obtain the conductive film forming composition B-8 containing F-containing migration inhibitor.

<Wiring Formation by Ink Jet>

Drawing was performed by ejecting the conductive film forming composition onto a glass substrate in the shape of a comb of L/S=75/75 μm using a material printer DMP-2831 (manufactured by FUJIFILM Dimatix, Inc.) under the conditions of an ejection rate of 10 pL and an ejection interval of 50 μm, and this drawing was performed by forming the composition into two layers. Thereafter, the resultant structure was subjected to baking in an oven at 230° C. for 1 hour to prepare a test wiring board. This method is denoted by "IJ" in the "Conductive film forming method" row of Table 1.

<Wiring Formation by Screen Printing>

The conductive film forming composition was printed onto a glass substrate in the shape of a comb of L/S=75/75 μm using a DP-320 type screen printing machine (manufactured by Newlong Seimitsu Kogyo Co., Ltd.) (a 300 mesh screen was used). Thereafter, the resultant structure was subjected to baking in an oven at 230° C. for 1 hour to prepare a test wiring board. This method is denoted by "screen" in the "Conductive film forming method" row of Table 1.

<Measurement Method of Test Wiring Film Thickness>

The prepared test wiring board was embedded in epoxy resin, and the section of the embedded test wiring board was exposed by means of polishing. Then, the exposed section was observed and the thickness of the conductive film was measured using S-3000N (SEM manufactured by Hitachi, Ltd.). The results are summarized in Table 1.

Here, in each of the test wiring boards, the region extending from the exposed surface of the conductive film to the depth corresponding to 1/10 of the total thickness of the conductive film was set to the surface layer region, and the rest of the conductive film was set to the inner region.

<Method of Measuring the Ratio (X/Y) of the Mass X of the F-containing Migration Inhibitor Contained in the Inner Region to the Mass Y of the F-containing Migration Inhibitor Contained in the Surface Layer Region>

The portion in which the F-containing migration inhibitor existed was detected using the above-mentioned SEM photograph and INCA PentaFETx3 (EDX manufactured by Oxford Instruments plc) to calculate the ratio (X/Y) of the mass X to the mass Y from the detection intensity and the area ratio in the inner region and the surface layer region. The results are summarized in Table 1.

<Conductivity Evaluation Method>

The conductivity evaluation of the obtained test wiring board was performed using the resistivity meter Loresta EP MCP-T360 (manufactured by Mitsubishi Chemical Analytech Co., Ltd.).

In the evaluation method, the measured resistance value of the prepared test wiring board was set to R1, the measured resistance value of the comparative wiring board prepared by only using the conductive film forming composition not containing F-containing migration inhibitor was set to R2, and the change rate thereof, R1/R2, was calculated. The evaluation was performed according to the following criteria. The results are summarized in Table 1. A wiring board of which the rank is C or higher (C, B or A) is practically usable, and a wiring board of which the rank is B or higher (B or A) is preferable.

A: R1/R2≤1.1
B: 1.1<R1/R2≤1.25
C: 1.25<R1/R2≤2.0
D: 2.0<R1/R2

Here, in Examples 1 to 5 and Comparative Examples 1 and 4, the evaluation was performed using the comparative wiring board which had been prepared by the above-mentioned ink jet and using the conductive film forming composition A-1.

In Examples 6 and 7, and Comparative Examples 2 and 5, the evaluation was performed using the comparative wiring board which had been prepared by the above-mentioned screen printing and using the conductive film forming composition A-2.

In Example 8 and Comparative Example 3, the evaluation was performed using the comparative wiring board which had been prepared by the above-mentioned ink jet and using the conductive film forming composition A-3.

<Insulation Reliability Evaluation Method>

Lifetime measurement was performed using the test wiring board under the conditions of a humidity of 85%, a temperature of 85° C., a pressure of 1.0 atm, and a voltage of 80 V (on a measuring instrument EHS-221MD manufactured by ESPEC Corporation).

In the evaluation method, first, lifetime measurement was performed under the above conditions by using an insulation reliability test board, which had been prepared by sticking high transparent adhesive transfer tape 8146-2 (manufactured by 3M Corporation) onto the test wiring board and sticking a glass substrate to the opposite side of the tape, and measuring the time T1 until the resistance value between the wiring layers became $1 \times 10^5 \Omega$.

Next, another insulation reliability test board was prepared in the above-mentioned manner using the comparative test wiring board as prepared by only using the conductive film forming composition not containing F-containing migration inhibitor. The lifetime measurement was performed under the above conditions by using the insulation reliability test board as newly prepared, and measuring the time T2 until the resistance value between the wiring layers became $1 \times 10^5 \Omega$.

The lifetime improvement effect (T1/T2) was calculated using the time T1 and the time T2 obtained. The evaluation was performed according to the following criteria. The results are summarized in Table 1. A wiring board of which the rank is C or higher (C, B or A) is practically usable, and a wiring board of which the rank is B or higher (B or A) is preferable.

A: T1/T2≥5
B: 5>T1/T2≥2
C: 2>T1/T2>1
D: 1≥T1/T2

Here, in Examples 1 to 5 and Comparative Examples 1 and 4, the evaluation was performed using the comparative wiring board which had been prepared by the above-mentioned ink jet and using the conductive film forming composition A-1.

In Examples 6 and 7, and Comparative Examples 2 and 5, the evaluation was performed using the comparative wiring board which had been prepared by the above-mentioned screen printing and using the conductive film forming composition A-2.

In Example 8 and Comparative Example 3, the evaluation was performed using the comparative wiring board which had been prepared by the above-mentioned ink jet and using the conductive film forming composition A-3.

TABLE 1

|  | Ex. 1 | Ex. 2 | Ex. 3 | Ex. 4 | Ex. 5 | Ex. 6 | Ex. 7 | Ex. 8 |
|---|---|---|---|---|---|---|---|---|
| Conductive film forming composition | B-1 | B-2 | B-3 | B-4 | B-5 | B-6 | B-7 | B-8 |
| F-containing migration inhibitor | M-1 | M-2 | M-3 | M-4 | M-5 | M-1 | M-3 | M-6 |
| Conductive film forming method | IJ | IJ | IJ | IJ | IJ | screen | screen | IJ |
| Total thickness of conductive film (μm) | 1.6 | 1.7 | 1.6 | 1.6 | 2.1 | 4.1 | 4.0 | 1.9 |
| Mass X/mass Y | 0.07 | 0.08 | 0.05 | 0.07 | 0.03 | 0.04 | 0.03 | 0.05 |
| Conductivity evaluation | B | B | B | B | B | A | A | B |
| Insulation reliability evaluation | A | A | A | A | A | A | A | A |

|  | Comp. Ex. 1 | Comp. Ex. 2 | Comp. Ex. 3 | Comp. Ex. 4 | Comp. Ex. 5 |
|---|---|---|---|---|---|
| Conductive film forming composition | A-1 | A-2 | A-3 | B-9 | B-10 |
| F-containing migration inhibitor | — | — | — | — | — |
| Conductive film forming method | IJ | screen | IJ | IJ | screen |
| Total thickness of conductive film (μm) | 1.6 | 4.0 | 1.6 | 1.8 | 4.1 |
| Mass X/mass Y | — | — | — | — | — |
| Conductivity evaluation | A | A | A | D | D |
| Insulation reliability evaluation | D | D | D | A | A |

As shown in Table 1, in Examples 1 to 8 in each of which a F-containing migration inhibitor was used, it was confirmed that the F-containing migration inhibitor in the conductive film was unevenly distributed in the surface layer region, the conductive characteristics of the conductive film were excellent, and the insulation reliability (ion migration inhibiting ability) of the conductive film was also excellent.

In contrast, in Comparative Examples 1 to 5 in each of which a F-containing migration inhibitor was not included, the conductivity or the insulation reliability (ion migration inhibiting ability) was inferior. For example, in Comparative Examples 1 to 3 in each of which a F-containing migration inhibitor was not included, the conductive characteristics were excellent, but the insulation reliability (ion migration inhibiting ability) was inferior. Further, in Comparative Examples 4 and 5 in each of which a migration inhibitor not containing a fluorine atom was included, the insulation reliability (ion migration inhibiting ability) was excellent, but the conductive characteristics were inferior because the uneven distribution of the migration inhibitor did not occur.

What is claimed is:

1. A conductive film forming composition, comprising:

a migration inhibitor containing a fluorine atom; and a metal particle, wherein the migration inhibitor includes polymer A having a repeating unit represented by General Formula (26) and a repeating unit represented by General Formula (27):

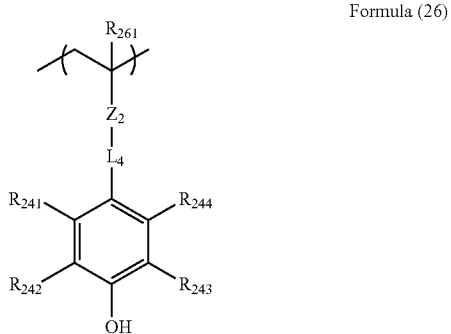

Formula (26)

-continued

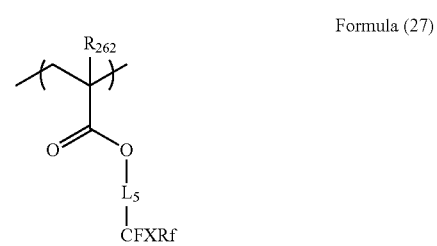

Formula (27)

in General Formula (26) and General Formula (27): each of $R_{261}$ and $R_{262}$ independently represents a hydrogen atom or a substituted or unsubstituted alkyl group having 1 to 4 carbon atoms; each of $R_{241}$ and $R_{244}$ independently represents a hydrogen atom; each of $R_{242}$ and $R_{243}$ independently represents an alkyl group; $Z_2$ represents a single bond, an ester group, an amido group, or an ether group; $L_4$ represents a single bond or a divalent organic group; $L_5$ represents a single bond or a divalent organic group having 1 to 6 carbon atoms and containing no fluorine; X represents a hydrogen atom, a fluorine atom, or a trifluoromethyl group; Rf represents a fluoroalkyl group having 20 or less carbon atoms, which may have an ethereal oxygen atom and in which at least one hydrogen atom is substituted with a fluorine atom, or represents a fluorine atom.

2. The conductive film forming composition according to claim 1, wherein a metal atom contained in the metal particle is selected from the group consisting of gold, silver, copper, and aluminum.

3. A conductive film, which is made of the conductive film forming composition according to claim 1.

4. A conductive film, which is made of the conductive film forming composition according to claim 2.

* * * * *